(12) United States Patent
Jo

(10) Patent No.: US 9,425,237 B2
(45) Date of Patent: Aug. 23, 2016

(54) SELECTOR DEVICE FOR TWO-TERMINAL MEMORY

(71) Applicant: Crossbar, Inc., Santa Clara, CA (US)

(72) Inventor: Sung Hyun Jo, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 14/588,185

(22) Filed: Dec. 31, 2014

(65) Prior Publication Data

US 2015/0263069 A1 Sep. 17, 2015

Related U.S. Application Data

(60) Provisional application No. 61/951,454, filed on Mar. 11, 2014, provisional application No. 62/021,660, filed on Jul. 7, 2014.

(51) Int. Cl.
*H01L 27/24* (2006.01)
*G11C 13/00* (2006.01)
*H01L 45/00* (2006.01)

(52) U.S. Cl.
CPC ........ *H01L 27/2418* (2013.01); *G11C 13/0002* (2013.01); *H01L 27/2481* (2013.01); *H01L 45/08* (2013.01); *H01L 45/1266* (2013.01); *H01L 45/16* (2013.01)

(58) Field of Classification Search
CPC ....... H01L 45/04; H01L 45/08; H01L 45/085; H01L 27/2409; H01L 27/2418
See application file for complete search history.

(56) References Cited

U.S. PATENT DOCUMENTS

| | | | |
|---|---|---|---|
| 6,849,891 | B1 | 2/2005 | Hsu et al. |
| 6,855,975 | B2 | 2/2005 | Gilton |
| 7,579,612 | B2 | 8/2009 | Tang et al. |
| 7,791,060 | B2 | 9/2010 | Aochi et al. |
| 7,830,698 | B2 | 11/2010 | Chen et al. |
| 8,218,350 | B2 | 7/2012 | Kozicki |
| 8,369,139 | B2 | 2/2013 | Liu et al. |
| 8,502,185 | B2 | 8/2013 | Lu et al. |
| 2004/0170040 | A1 | 9/2004 | Rinerson et al. |

(Continued)

FOREIGN PATENT DOCUMENTS

| | | |
|---|---|---|
| CN | 101501850 A | 8/2009 |
| JP | 201123645 A | 2/2011 |
| WO | 2011005266 A1 | 1/2011 |

OTHER PUBLICATIONS

Wouters, "Scaling challenges for 2-terminal select devices," ITRS ERD Selector Workshop, Apr. 2012, 41 pages, IMEC, Noorderwijk, NL.

(Continued)

*Primary Examiner* — Allison P Bernstein
(74) *Attorney, Agent, or Firm* — Amin, Turocy & Watson, LLP

(57) ABSTRACT

Solid-state memory having a non-linear current-voltage (I-V) response is provided. By way of example, the solid-state memory can be a selector device. The selector device can be formed in series with a non-volatile memory device via a monolithic fabrication process. Further, the selector device can provide a substantially non-linear I-V response suitable to mitigate leakage current for the non-volatile memory device. In various disclosed embodiments, the series combination of the selector device and the non-volatile memory device can serve as one of a set of memory cells in a 1-transistor, many-resistor resistive memory cell array.

20 Claims, 14 Drawing Sheets

(56) References Cited

U.S. PATENT DOCUMENTS

| | | |
|---|---|---|
| 2006/0231910 A1 | 10/2006 | Hsieh et al. |
| 2008/0192531 A1 | 8/2008 | Tamura et al. |
| 2009/0014707 A1 | 1/2009 | Lu et al. |
| 2010/0157656 A1 | 6/2010 | Tsuchida |
| 2010/0243983 A1 | 9/2010 | Chiang et al. |
| 2011/0033967 A1 | 2/2011 | Lutz et al. |
| 2011/0089391 A1 | 4/2011 | Mihnea et al. |
| 2012/0007035 A1 | 1/2012 | Jo et al. |
| 2012/0044751 A1 | 2/2012 | Wang et al. |
| 2012/0122290 A1 | 5/2012 | Nagashima |
| 2012/0176831 A1 | 7/2012 | Xiao et al. |
| 2012/0314472 A1 | 12/2012 | Chung |
| 2013/0264534 A1* | 10/2013 | Hwang et al. ............... 257/2 |
| 2014/0231740 A1* | 8/2014 | Ohba ............................ 257/2 |
| 2014/0284544 A1* | 9/2014 | Miyagawa et al. .......... 257/4 |

OTHER PUBLICATIONS

International Search Report and Written Opinion for PCT Application No. PCT/US2015/17370 mailed Jul. 13, 2015, 17 pages.

Chinese Office Action dated Nov. 23, 2015 for Chinese Patent Application No. 201280027066.9, 6 pages.

Office Action dated Oct. 3, 2013 for U.S. Appl. No. 13/921,157, 10 pages.

International Search Report and Written Opinion for PCT Application No. PCT/US2012/040232 mailed Feb. 26, 2013, 9 pages.

Office Action dated May 7, 2013 for U.S. Appl. No. 13/585,759, 12 pages.

Office Action dated May 23, 2013 for U.S. Appl. No. 13/592,224, 9 pages.

Notice of Allowance dated Sep. 19, 2013 for U.S. Appl. No. 13/585,759, 9 pages.

Office Action dated Dec. 6, 2013 for U.S. Appl. No. 13/960,735, 10 pages.

International Search Report and Written Opinion for PCT Application No. PCT/US2013/054976 mailed Dec. 16, 2013, 9 pages.

Notice of Allowance dated Jul. 22, 2015 for U.S. Appl. No. 14/612,025, 11 pages.

Office Action dated Apr. 8, 2016 for U.S. Appl. No. 14/573,770, 8 Pages.

* cited by examiner

SELECTOR LAYER FILAMENT BEHAVIOR FROM TOP ELECTRODE
200

SELECTOR DEVICE FOR TWO-TERMINAL MEMORY

CROSS REFERENCE TO RELATED APPLICATIONS

This application for patent claims the benefit of U.S. provisional patent application Ser. No. 61/951,454, entitled SELECTOR DEVICE FOR TWO TERMINAL DEVICE and filed Mar. 11, 2014, and claims the benefit of US provisional patent application Ser. No. 62/021,660, entitled FAST Applications and filed Jul. 7, 2014, each of which are incorporated by reference herein in their respective entireties and for all purposes.

TECHNICAL FIELD

This disclosure relates generally to electronic memory, for example, the disclosure describes a selector device configured to provide non-linear current-voltage response for a memory device.

BACKGROUND

A recent innovation within the field of integrated circuit technology is resistive memory. While much of resistive memory technology is in the development stage, various technological concepts for resistive memory have been demonstrated by the assignee of the present invention and are in one or more stages of verification to prove or disprove associated theory(ies). Even so, resistive memory technology promises to hold substantial advantages over competing technologies in the semiconductor electronics industry.

Resistive random access memory (RRAM) is one example of resistive memory. The inventors of the present disclosure believe RRAM has the potential to be a high density non-volatile information storage technology. Generally, RRAM stores information by controllably switching among distinct resistive states. A single resistive memory can store a single bit of information, or multiple bits, and can be configured as a one-time programmable cell, or a programmable and erasable device, as various memory models demonstrated by the assignee provide.

Various theories have been proposed by the inventors to explain the phenomenon of resistive switching. In one such theory, resistive switching is a result of formation of a conductive structure within an otherwise electrically insulating medium. The conductive structure could be formed from ions, atoms that can be ionized under appropriate circumstances (e.g., a suitable electric field), or other charge carrying mechanisms. In other such theories, field-assisted diffusion of atoms can occur in response to a suitable electric potential applied to a resistive memory cell. In still other theories proposed by the inventors, formation of the conductive filament can occur in response to joule heating and electrochemical processes in binary oxides (e.g., NiO, $TiO_2$, or the like), or by a redox process for ionic conductors including oxides, chalcogenides, polymers, and so on.

The inventors expect resistive devices based on an electrode, insulator, electrode model to exhibit good endurance and life cycle. Further, the inventors expect such devices to have high on-chip densities. Accordingly, resistive elements may be viable alternatives to metal-oxide semiconductor (MOS) transistors employed for digital information storage. The inventors of the subject patent application, for instance, believe that models of resistive-switching memory devices provide some potential technical advantages over non-volatile Flash MOS devices.

In light of the above, the inventors endeavor to make further improvements in memory technology, and resistive memory.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

In various embodiments of the present disclosure, there is provided a selector device for solid state memory applications. The selector device can be configured to have a non-linear current-voltage (I-V) relationship, in various embodiments. Furthermore, the selector device can, in isolation, be a volatile device that has a first electrical state in response to a first electrical condition, and a second electrical state in absence of the first electrical condition.

In one or more embodiments, disclosed is a monolithic solid state construct formed in series with a non-volatile memory device. The monolithic solid state construct can be a selector device, as provided herein. Further, the selector device can provide a substantially non-linear I-V response suitable to mitigate leakage current for the non-volatile memory device. Thus, in at least some embodiments, the series combination of the monolithic solid state construct and the non-volatile memory device can serve as one of a set of memory cells in a 1-transistor, many-resistor (1T-nR) resistive memory cell array (e.g., the memory cell being a 1-selector, 1-resistor (1S-1R) configuration).

In still additional embodiments, disclosed is a selector device configured to exhibit a non-linear I-V relationship to different polarity signals. For instance, the selector device can exhibit a first non-linear I-V relationship in response to a signal of a first polarity, and a second non-linear I-V relationship in response to a second signal of a second polarity. In some embodiments, the first non-linear I-V relationship and the second non-linear I-V relationship can have similar or the same curvatures, whereas in other embodiments the first non-linear I-V relationship and the second non-linear I-V relationship can have different curvatures. The selector device can be provided in series with a bipolar memory device, in further embodiments. In such embodiments, the selector device can provide a non-linear response for read and write operations of a first polarity, as well as erase operations of a second polarity.

In a further embodiment, there is provided a method for forming a selector device for a two-terminal memory device. The method can comprise providing a first layer structure comprising a first metal material and providing a layer of selector material in contact with the first layer structure. Moreover, the method can comprise providing a second layer structure comprising a second metal material and in contact with the layer of the selector material. In various embodiments, the first metal material or the second metal material can be configured to provide conductive ions to the selector material in response to a voltage of a first polarity or a second polarity, respectively, applied across the first layer structure and the second layer structure and the selector material is configured to allow the conductive ions to permeate within the layer of selector material in response to the voltage applied across the first layer structure and the second layer structure. In alternative or additional embodiments, the first layer structure, the layer of selector material, and the second layer structure form the selector device and the selector device is disposed in electrical series with the two-terminal memory device.

In yet other disclosed embodiments, the subject disclosure provides a selector device for a two-terminal memory. The selector device can comprise a first layer structure comprising a first metal material and a layer of selector material in contact with the first layer structure. Further, the selector device can comprise a second layer structure in contact with the layer of the selector material and comprising a second metal material. In some embodiments, the first metal material or the second metal material can be configured to provide conductive ions to the selector material in response to a threshold voltage of a first polarity or a second polarity, respectively, applied across the first layer structure and the second layer structure. In other embodiments, the selector material is configured to allow the conductive ions to permeate within the layer of selector material in response to the threshold voltage applied across the first layer structure and the second layer structure. According to still other embodiments, the selector device is disposed in electrical series with the two-terminal memory device.

Further to the above, the disclosure provides a method of operating a crossbar memory array comprising a plurality of two-terminal memory devices and a plurality of selector devices, wherein each of the plurality of two-terminal memory devices is associated in series with one selector device from the plurality of selector devices, wherein each selector device is associated with a first electrical characteristic in response to an applied voltage less than a threshold voltage, and associated with a second electrical characteristic in response to an applied voltage greater or equal to the threshold voltage. The method can comprise applying a first voltage greater than the threshold voltage to a first memory structure comprising a first two terminal memory device in series with a first selector device. The method can additionally comprise applying a second voltage, concurrently with applying the first voltage, that is less than the threshold voltage to a second memory structure comprising a second two-terminal memory device in series with a second selector device. Moreover, the method can comprise determining a current in response to applying the first voltage concurrent with applying the second voltage. In at least one embodiment, the current comprises a first current associated with the first selector device and a second current associated with the second selector device. In one or more additional embodiments, a current ratio of the first current to the second current is within a range of ratios selected from a group of ranges consisting of: about 1,000 to about 10,000, about 10, 000 to about 100,000, about 100,000 to about 1,000,000, and about 1,000,000 to about 10,000,000. In light of the present disclosure, current ratios in excess of 10,000,000 are envisioned.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
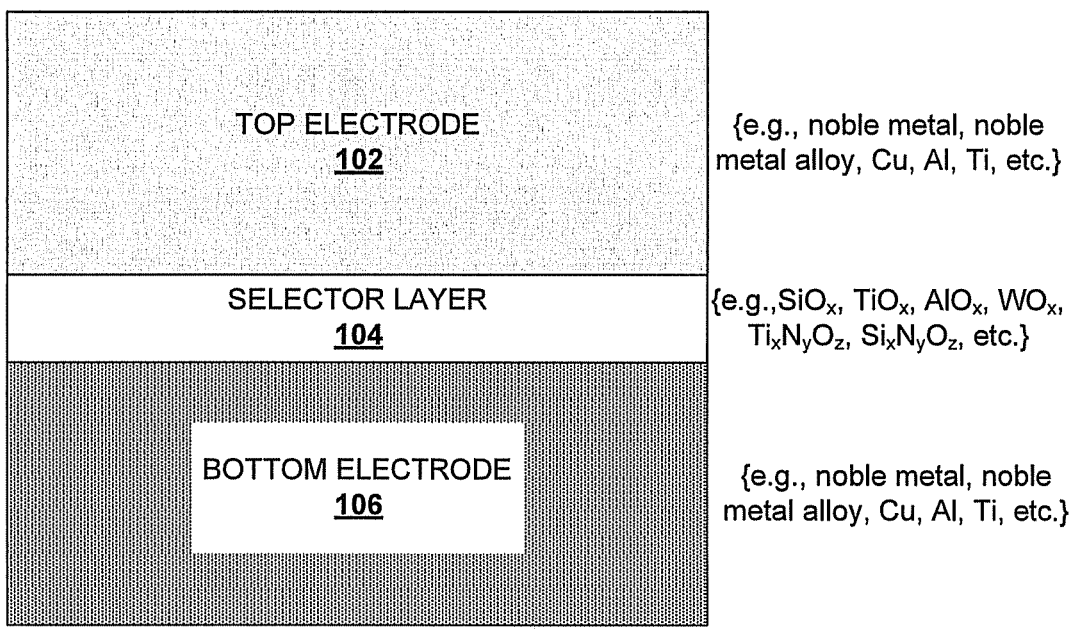
FIG. 1 depicts a block diagram of an example monolithic structure providing a solid state selector device according to various disclosed embodiments.

This disclosure relates to a selector device for a two-terminal memory cell employed for digital information storage. In some embodiments, the two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having conductive contacts with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. Examples of a resistive switching two-terminal memory device, though not exhaustive, can include a resistive random access memory (RRAM), a phase change RAM (PCRAM) and a magnetic RAM (MRAM).

Embodiments of the subject disclosure can provide a volatile selector device that can be integrated with a non-volatile memory cell. In various embodiments, the volatile selector device or the non-volatile memory cell can be filamentary-based devices. One example of a filamentary-based device can comprise: a conductive layer, e.g., metal, doped p-type (or n-type) silicon (Si) bearing layer (e.g., p-type or n-type polysilicon, p-type or n-type polycrystalline SiGe, etc.), a resistive switching layer (RSL) and an active metal layer capable of being ionized. Under suitable conditions, the active metal layer can provide filament forming ions to the RSL. In such embodiments, a conductive filament (e.g., formed by the ions) can facilitate electrical conductivity through at least a subset of the RSL, and a resistance of the filament-based device can be determined by a tunneling resistance between the filament and the conductive layer.

In various embodiments of a memory cell of the present disclosure, a p-type or n-type Si bearing layer can include a p-type or n-type polysilicon, p-type or n-type polycrystalline SiGe, or the like. A RSL (which can also be referred to in the art as a resistive switching media (RSM)) can comprise, e.g., an undoped amorphous Si layer, a semiconductor layer having intrinsic characteristics, a Si sub-oxide (e.g., SiOx wherein x has a value between 0.1 and 2), and so forth. Other examples of materials suitable for the RSL could include $Si_XGe_YO_Z$ (where X, Y and Z are respective suitable positive numbers), a silicon oxide (e.g., $SiO_N$, where N is a suitable positive number), amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number) and so forth, or a suitable combination thereof. In various embodiments, the RSL includes a number of material voids or defects.

An active metal layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum(Ta), iron (Fe), manganese (Mn), tungsten (W), vanadium (V), cobalt (Co), platinum (Pt), hafnium (Hf), and palladium (Pd). Other suitable conductive materials, as well as compounds, alloys, or combinations of the foregoing or similar materials can be employed for the active metal layer in some aspects of the subject disclosure. Some details pertaining to embodiments of the subject disclosure similar to the foregoing example(s) can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

In various disclosed embodiments, filamentary-based switching devices are disclosed and their operation is described. In some embodiments, a filamentary-based switching device can be a volatile switching device, which exhibits a first measurably distinct state in the absence of a suitable external stimulus, and exhibits a second measurably distinct state in response to the suitable external stimulus. The volatile filamentary-based switching device is often referred to herein as a selector device, or selection device, filamentary selector device, filamentary-based selector device, and so on; though such devices, their composition or application should not be limited by this terminology. In other embodiments, a filamentary-based switching device can be a non-volatile switching device, which exhibits a first measurably distinct state until a suitable first external stimulus is applied to change the non-volatile switching device to a second measurably distinct state. The non-volatile switching device then exhibits the second measurably distinct state until a suitable second external stimulus is applied. Non-volatile filamentary-based switching devices can have more than two measurably distinct states, leading to multi-level cell functionality, though this disclosure refers generally to the binary case. Non-volatile filamentary-based switching devices are generally referred herein as a memory cell, resistive memory cell, filamentary-based memory cell, or the like, but again the composition, function or application of such devices should not be limited by this terminology.

A filamentary selector device can exhibit a first state (e.g., a first electrical resistance, or other suitable measurable characteristic) in the absence of a suitable external stimulus. The stimulus can have a threshold value or range of such values that induces the filamentary selector device to change from the first state to a second state while the stimulus is applied. In response to the stimulus falling below the threshold value (or threshold range of values) the filamentary selector device returns to the first state. In some disclosed embodiments, a filamentary based selector device can operate in a bipolar fashion, behaving differently in response to different polarity (or direction, energy flow, energy source orientation, etc.) external stimuli. As an illustrative example, in response to a first polarity stimulus exceeding a first threshold voltage (or set of voltages), the filamentary selector device can change to the second state from the first state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), having the same or similar magnitude of threshold stimulus (though of opposite polarity or direction), or the like. In other embodiments, the third state can be distinct from the second state, either in terms of the measurable characteristic (e.g., different electrically conductivity value in response to the reverse polarity as compared to the forward polarity) or in terms of threshold stimulus associated with transitioning out of the first state (e.g., a different magnitude of positive voltage required to transition to the second state, compared to a magnitude of negative voltage required to transition to the third state).

In some embodiments, and by way of example, a disclosed filamentary based selector device can form a conductive path or filament through a relatively high resistive portion in response to a suitable external stimulus. The external stimulus can cause metallic particles within an active metal layer to migrate within (or ionize within) a RSL layer of the filamentary selector device. Further, the RSL can be selected to have relatively few physical defect locations for the volatile filamentary switching device, facilitating relatively good mobility of the metallic particles within the RSL. Accordingly, below an associated threshold stimulus (or narrow range of threshold values), the metallic particles can be dispersed within the RSL to prevent formation of a sufficient conductive path through the RSL to lower a high resistance associated with the first state. Above the threshold, the external stimulus maintains the metallic particles in sufficient formation to provide the conductive path, leading to relatively low resistance of the second state. An analogous mechanism can control operation of the third state in the bipolar context.

For a non-volatile filamentary-based resistive switching memory cell, an RSL can be selected to have sufficient physical defect sites therein so as to trap particles in place in the absence of a suitable external stimulus, mitigating particle mobility and dispersion. This, in response to a suitable program voltage applied across the memory cell, a conductive path or a filament forms through the RSL. In particular, upon application of a programming bias voltage, metallic ions are generated from the active metal layer and migrate into the RSL layer. More specifically, metallic ions migrate to the voids or defect sites within the RSL layer. In some embodiments, upon removal of the bias voltage, the metallic ions become neutral metal particles and remain trapped in voids or defects of the RSL layer. When sufficient particles become trapped, a filament is formed and the memory cell switches from a relatively high resistive state, to a relatively low resistive state. More specifically, the trapped metal particles provide the conductive path or filament through the RSL layer, and the resistance is typically determined by a tunneling resistance through the RSL layer. In some resistive-switching devices, an erase process can be implemented to deform the conductive filament, at least in part, causing the memory cell to return to the high resistive state from the low resistive state. More specifically, upon application of an erase bias voltage, the metallic particles trapped in voids or defects of the RSL become mobile and migrate back towards the active metal layer. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information In various embodiments, multi-level information (e.g., multiple bits) may be stored in such memory cells.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventors of the subject application are familiar with additional non-volatile, two-terminal memory structures in addition to resistive memory. For example, ferroelectric random access memory (RAM) is one example. Some others include magneto-resistive RAM, organic RAM, phase change RAM and conductive bridging RAM, and so on. Two-terminal memory technologies have differing advantages and disadvantages, and trade-offs between advantages and disadvantages are common. Though resistive-switching memory technology is referred to with many of the embodiments disclosed herein, other two-terminal memory technologies can be utilized for some of the disclosed embodiments, where suitable to one of ordinary skill in the art.

High density integration of memory often utilizes an array structure, in which multiple cells are connected along conductive lines of an integrated chip, such as bitlines, wordlines, datalines, sourcelines, and the like. However, the inventors of the present disclosure believe that, while connecting multiple cells to a common conductive line can enhance memory density, such an arrangement can also result in electrical problems such as leakage current (e.g., see FIG. 8, infra), reduced sensing margin, excess power consumption, and the like. This can be particularly evident for memory cells programmed to a low resistance state. As an illustrative example, an operational voltage applied to a selected conductive line, that is commonly connected to a target memory cell and several non-targeted memory cells, can result in significant current flow at non-targeted memory cells in a low resistance state. Where a large number of non-targeted memory cells are connected to the selected conductive line (e.g., to achieve high memory density), significant power is consumed by this current. Additionally, capacitive voltages on nearby conductive lines caused by the operational voltage can result in leakage current from the nearby conductive lines to the selected conductive line. In addition to consuming additional power, this leakage current reduces sensing margin for a memory operation performed on the target memory cell.

To reduce excess power consumption and leakage current in a memory array, a transistor may be connected to each memory cell, sometimes referred to as a 1 transistor-1 memory cell architecture. The transistor can be deactivated to shut off current through the memory cell, minimizing leakage current at that memory cell. However, addition of a transistor for each memory cell can significantly increase size of the memory cell (and reduce density of an associated array of memory). Some memory arrays balance memory density with leakage current, by implementing a 1 transistor-n memory cell architecture, where n is an integer greater than 1. In this architecture, increasing the number, n, of memory cells per transistor implements a trade-off between memory density and leakage current and power consumption. Thus, the inventors understand that traditional attempts to achieve increased memory density can result in increased power consumption and associated joule heating, reduced sensing margin, and other problems.

Various embodiments of the present disclosure provide a selector device (e.g., a volatile switching device) configured to provide non-linear current-voltage (I-V) response for a memory cell (e.g., a non-volatile switching device) associated with the selector device. In particular, the non-linear I-V response can significantly reduce leakage current at the associated memory cell. Further, the selector device can be a monolithic solid state construct fabricated in conjunction with the associated memory cell that does not substantially increase the size of the memory cell. In the context of resistive memory cell technology, the disclosed selector device can facilitate a 1 transistor-n resistor (1T-nR) architecture with high memory density. In some embodiments, the number of memory cells, n, per transistor can be 512, 1024, or even larger, without significantly impacting leakage current of a memory array. Accordingly, the disclosed selector device can facilitate high memory densities with low leakage current, low power consumption and good sensing margin.

Referring now to the drawings, FIG. 1 illustrates a block diagram of an example selector device 100 according to one or more embodiments of the present disclosure. Selector device 100 can be a two-terminal device configured to be operable in response to a suitable electric signal applied at one or more of two terminals of selector device 100. In various disclosed embodiments, selector device 100 can have a non-linear I-V response, in which selector device 100 exhibits current within a first range in response to a first range of voltage magnitudes, and current within a second range (e.g., much higher in magnitude than the first range) in response to a second range of voltage magnitudes (e.g., see FIGS. 5 and 6, infra). The first range of voltage magnitudes and second range of voltage magnitudes can be distinguished, as one example, by a threshold voltage, or a threshold range of voltages (e.g., having magnitude(s) between the first range of voltage magnitudes and the second range of voltage magnitudes). In further embodiments, selector device 100 can be fabricated in series with a two-terminal memory device (not depicted, but see FIGS. 7 and 8, infra) as part of a monolithic fabrication process (e.g., photolithographic process, mask and etching process, and so forth). In these latter embodiments, selector device 100 can be configured to provide a non-linear I-V response for the two-terminal memory device, reducing leakage current and lowering power consumption, while facilitating increased memory density for an array of such memory cells in series with respective ones of selector device 100. For instance, in the case of a two-terminal resistive memory cell, selector device 100 can facilitate a high density 1T-nR memory array with relatively high values for n, while mitigating leakage current and reducing power consumption for the 1T-nR memory array. In various embodiments, selector device 100 may be embodied as a FAST™ selector device, currently under development by the current assignee of the present patent application.

Selector device 100 is depicted by FIG. 1 to have a top electrode 102 and a bottom electrode 106. Top electrode 102 and bottom electrode 106 are electrical conductors, and are comprised of materials suitable to facilitate conduction of current. In one or more embodiments, top electrode 102 and bottom electrode 106 can comprise a material(s) providing or facilitates provision of mobile atoms or ions in response to a suitable stimulus. Examples of suitable stimuli can include an electric field (e.g. a programming voltage), joule heating, a magnetic field, or other suitable stimuli for directed or partially directed particle motion. In at least one embodiment, particle mobility can be in response to undirected or partially undirected dispersion, or similar phenomena.

Examples of suitable materials for top electrode 102 or bottom electrode 106 can include a noble metal (e.g., Ag, Pd, Pt, Au, etc.) or a metal alloy containing noble metal in part (e.g., Ag—Al, Ag—Pd—Cu, Ag—W, Ag—Ti, Ag—TiN, Ag—TaN, and so forth). A noble metal or alloy thereof can be utilized to facilitate mitigated interaction between top electrode 102 or bottom electrode 106 and a selector layer 104, for instance. This mitigated particle interaction (e.g., mitigating or avoiding chemical bonding of top electrode 102 or bottom electrode 106 particles with particles of selector layer 104) can facilitate improved longevity and reliability for selector device 100, as one example. Another example of a suitable material for top electrode 102 or bottom electrode 106 can include a material with relatively fast diffusing particles. Faster diffusion can include, for instance, a capacity to move among defect sites (e.g., voids or gaps in molecular material) within a solid, facilitating dispersion of the relatively fast diffusion particles absent an aggregating force, for instance. Materials with relatively fast diffusing particles can facilitate fast state switching of selector device 100 (e.g., from a non-conductive state to a conductive state), at lower bias values. Examples of suitable fast diffusing materials can include Ag, Cu, Au, Co, Ni, Al, Fe, or the like, suitable alloys thereof, or suitable combinations of the foregoing.

In at least one embodiment, top electrode 102 can be comprised of the same material or substantially the same material as bottom electrode 106. In other embodiments, top electrode 102 and bottom electrode 106 can be different materials. In still other embodiments, top electrode 102 and bottom electrode 106 can be at least in part the same material, and in part different materials. For instance, top electrode 102 could comprise a suitable conductive material, and bottom electrode 106 could at least in part comprise an alloy of the suitable conductive material, or the suitable conductive material in combination with another suitable conductor, as an illustrative example.

In addition to the foregoing, selector device 100 includes selector layer 104. In contrast to top electrode 102 or bottom electrode 106, selector layer 104 can be an electrical insulator or ionic conductor. Further, selector layer 104 can be a material (e.g., an oxide) at least weakly permeable to particles of top electrode 102 or bottom electrode 106. In some embodiments, selector layer 104 can be a non-stoichiometric material. Examples of suitable materials for selector layer 104 can include $SiO_x$, $TiO_x$, $AlO_x$, $WO_x$, $Ti_xN_yO_z$, HfOx, TaOx, NbOx, or the like, or suitable combinations thereof, where x, y and z can be suitable non-stoichiometric values. In some embodiments, selector layer 104 can be a chalcogenide or a solid-electrolyte material containing one or more of Ge, Sb, S, Te. In yet another embodiment, the selector material can comprise a stack of a plurality of the above mentioned materials (e.g. SiOx/GeTe, TiOx/AlOx). In at least one embodiment of the present disclosure, selector layer 104 can be doped with a metal(s) during fabrication, to facilitate metal ion injection from the top or bottom electrode.

In operation, a suitable electric signal can be applied to top electrode 102 or bottom electrode 106 to induce a state change of selector device 100. State change can be a change in resistance or conductivity, for instance. As one illustrative example, a voltage, field, current, etc., can be applied at top electrode 102 or bottom electrode 106 having at least a threshold magnitude associated with inducing the state change of selector device 100. In response to such a signal at the threshold magnitude, selector device 100 can transition from a non-conducting state having a high electrical resistance and a first current (or a first range of currents), to a relatively-conducting state having a lower electrical resistance and a second current (or a second range of currents). In various embodiments, a current ratio of the first current to the second current can be at least about 1,000 or more. For instance, in one embodiment, the current ratio can be selected from a range of current ratios from about 1,000 to about 10,000. In another embodiment, the current ratio can be selected from a range of current ratios from about 10,000 to about 100,000. In yet another embodiment, the current ratio can be selected from a range of current ratios from about 100,000 to about 1,000,000. In still other embodiments, the current ratio can be selected from a range of current ratios from about 1,000,000 to about 10,000,000 or more. Other suitable current ratios can be provided for a selector device 100 in various other suitable embodiments.

Figure 2:
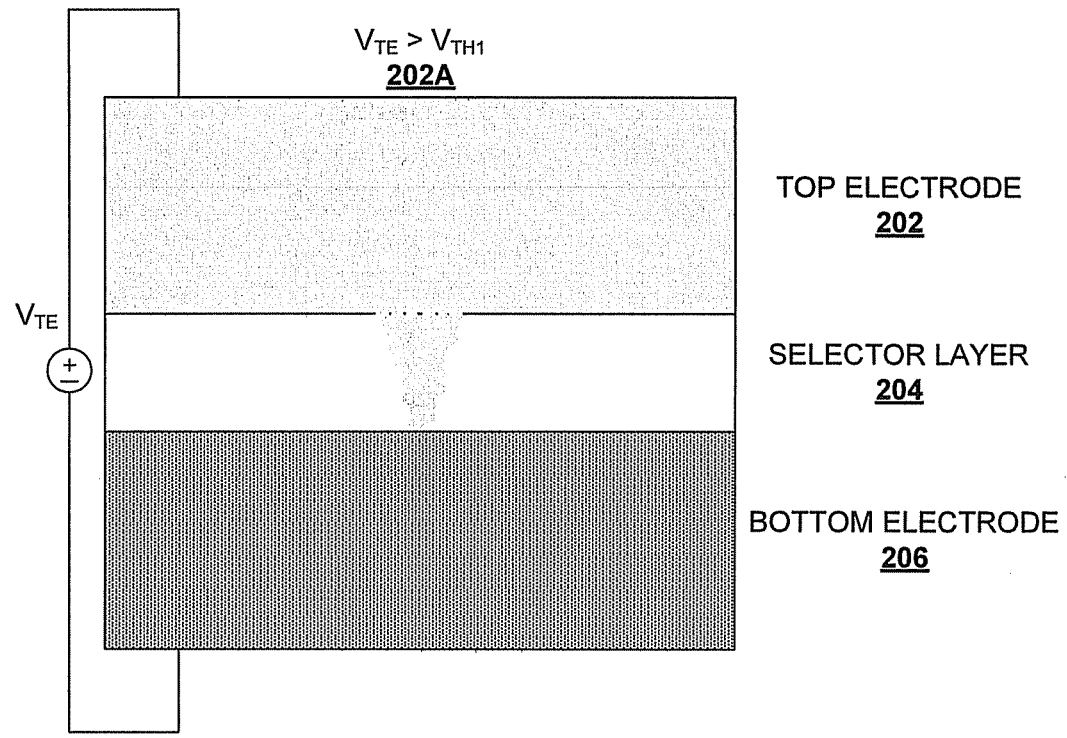
FIG. 2 illustrates a block diagram of a sample selector device behavior in response to an electrical characteristic of a first polarity.
Figure 2:
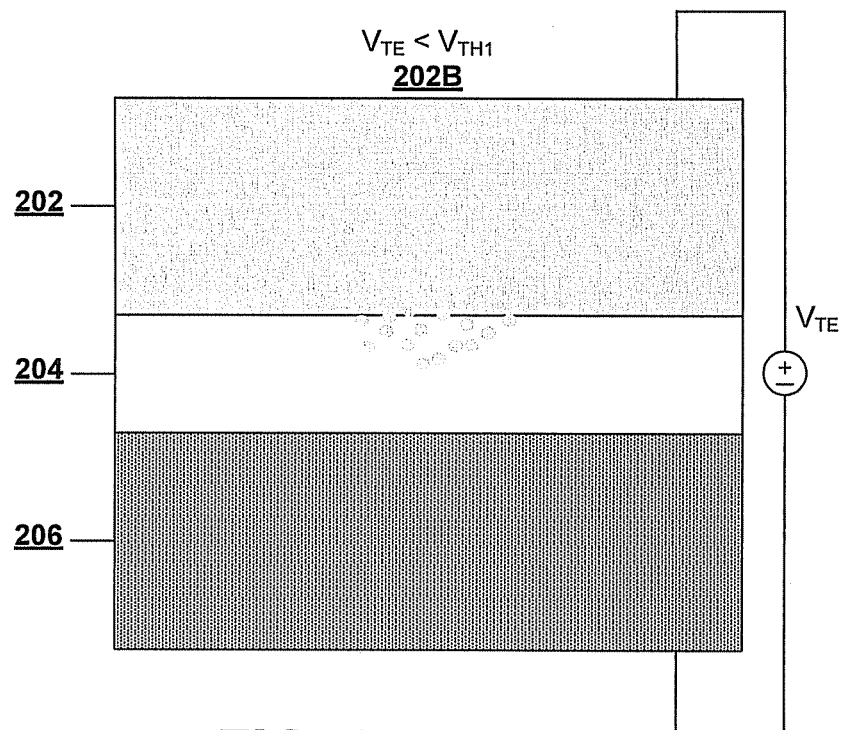

FIG. 2 illustrates a block diagram depicting operational behavior of a selector device 200 in response to applied signals, according to additional embodiments of the present disclosure. For instance, selector device 200 comprises a top electrode 202, selector layer 204 and bottom electrode 206, as depicted. In at least some embodiments, selector device 200 can be substantially similar to selector device 100 of FIG. 1, infra, although the subject disclosure is not so limited.

At the top of FIG. 2, selector device 200 is illustrated with a first signal 202A applied to selector device 200. First signal 202A is greater than a threshold magnitude associated with non-linear I-V response of selector device 200. In various embodiments, the threshold magnitude may be embodied as a narrow range of threshold magnitudes (e.g., see below). It should be appreciated that reference herein to a threshold magnitude (e.g., voltage magnitude) associated with a non-linear I-V response of a selector device could include a narrow range of threshold magnitudes (e.g., a range of voltage values) over which an I-V response transitions from linear (or approximately linear) behavior, to non-linear behavior. The range of magnitudes can vary as suitable for different sets of materials, arrangement of such materials, characteristics of such materials (e.g., thickness, area, conductivity, etc.), or the like, selected for components of the selector device.

Although first signal 202A is depicted as a voltage, e.g., where top electrode voltage $V_{TE}$ is greater than a first threshold voltage $V_{TH1}$ of selector device 200, in other embodiments first signal 202A can comprise other signals inducing particle mobility of particles of top electrode 202 or bottom electrode 206, such as an electric field, a current, or even a temperature associated with joule heating. In addition to the foregoing, first signal 202A can be of a first polarity (e.g., at least in the electrical sense). For instance, first signal 202A can have a positive gradient applied from top electrode 202 to bottom electrode 206 (e.g., a positive voltage or field at top electrode 202 and ground or negative voltage or field at 206, current flow from top electrode 202 to bottom electrode 206, and so forth).

In response to first signal 202A (top electrode 202 relative to bottom electrode 206), particles of top electrode 202 (or bottom electrode 206) can form a conductive path(s), or filament(s), within selector layer 204 as depicted. In some embodiments, the particles can migrate into selector layer 204 from top electrode 202 (or bottom electrode 206) in response to first signal 202A. In other embodiments—for instance where selector layer 204 is doped with metallic particles—particles within selector layer 204 can be ionized or aligned (e.g., spatially organized along the conductive path(s)) in response to first signal 202A. In still other embodiments, particles can migrate from top electrode 202 (or bottom electrode 206) in combination with existing particles within selector layer 204 being ionized and aligned in response to first signal 202A, to form the conductive path(s) if the selector layer is doped with metal particles. Formation of the conductive path(s) can facilitate transition from a non-conductive state to a conductive state, associated with non-linear I-V response of selector device 200. Moreover, suitable formation of the conductive path(s) can be in response to a magnitude of first signal 202A meeting or exceeding a first threshold magnitude. Thus, the first threshold magnitude is associated with causing the transition to the conductive state.

At the bottom of FIG. 2, selector device 200 observes a second signal 202B applied to top electrode 202 (relative to bottom electrode 206). Second signal 202B can have a magnitude less than the first threshold magnitude (e.g., $V_{TE} < V_{TH1}$ e.g. $V_{TE} \approx 0V$), and in response selector device 200 can transition from the (highly) conductive state to the (relatively) non-conductive state. Again, in various embodiments, the first threshold magnitude may span a narrow range of magnitudes. A conductive path(s) formed in response to first signal 202A can dissipate, at least in part, in response to second signal 202B, as depicted within selector layer 204 in the bottom of FIG. 2, or in response to removal of the first signal 202A. Dissipation can occur as a result of particle tendency to migrate within or out of selector layer 204, when an external force (e.g., second signal 202B) is of insufficient strength to hold the particles in the conductive path(s) through selector layer 204, from top electrode 202 through bottom electrode 206. Thus, in one embodiment below the lowest threshold magnitude from a narrow range of magnitudes, the conductive path(s) is at least in part deformed, whereas at or above the highest threshold magnitude from the narrow range of magnitudes, the conductive path(s) can be formed sufficiently enough to cause the conductive state for selector device 200. To reiterate the above, in various embodiments herein, it should be understood that reference to a threshold voltage may actually refer to a set of threshold voltages (e.g., within a narrow range of voltages) associated with formation and deformation of a conductive path.

As described above, selector device 200 can transition from the non-conductive state to the conductive state, and back to the non-conductive state, in a volatile manner. In other words, selector device 200 can be in the conductive state in response to the first signal 202A having the first threshold magnitude being applied to selector device 200. Selector device 200 can be in the non-conductive state in response to the second signal 202B having less than the first threshold magnitude being applied to the selector device 200.

In some embodiments, selector device 200 can be combined in electrical series with a two-terminal memory cell (e.g., a resistive switching memory, etc.). Selector device 200 can provide a non-linear I-V characteristic for a two-terminal memory cell when provided in series there with. Moreover, the non-linear I-V characteristic can be provided whether the two-terminal memory cell is in a conductive state or non-conductive state. For instance, a signal below the first threshold magnitude will cause selector device 200 to be in the non-conductive state. In the non-conductive state, selector device 200 will resist current through the series combination of selector device 200 and the two-terminal memory cell when the signal is below the first threshold. When the signal is equal to or above the threshold magnitude, selector device 200 will be conductive, and a state of the two-terminal memory cell can determine electrical characteristics of the series combination of: selector device 200 and the two-terminal memory cell. Thus, activating selector device 200 will facilitate operational access to the two-terminal memory cell. Deactivating selector device 200 will resist operational access to the two-terminal memory cell (e.g., by resisting current through the series combination, and by dropping a majority of the voltage applied across the series combination, etc.). Because selector device 200 is volatile, and in the non-conducting state in the absence of a signal having the first threshold magnitude, the two-terminal memory cell is inaccessible and retains information (e.g., retains a current state thereof). Selector device 200, on the other hand, provides a non-linear I-V response for the series combination, resisting leakage current and facilitating a memory array having high density.

Figure 3:
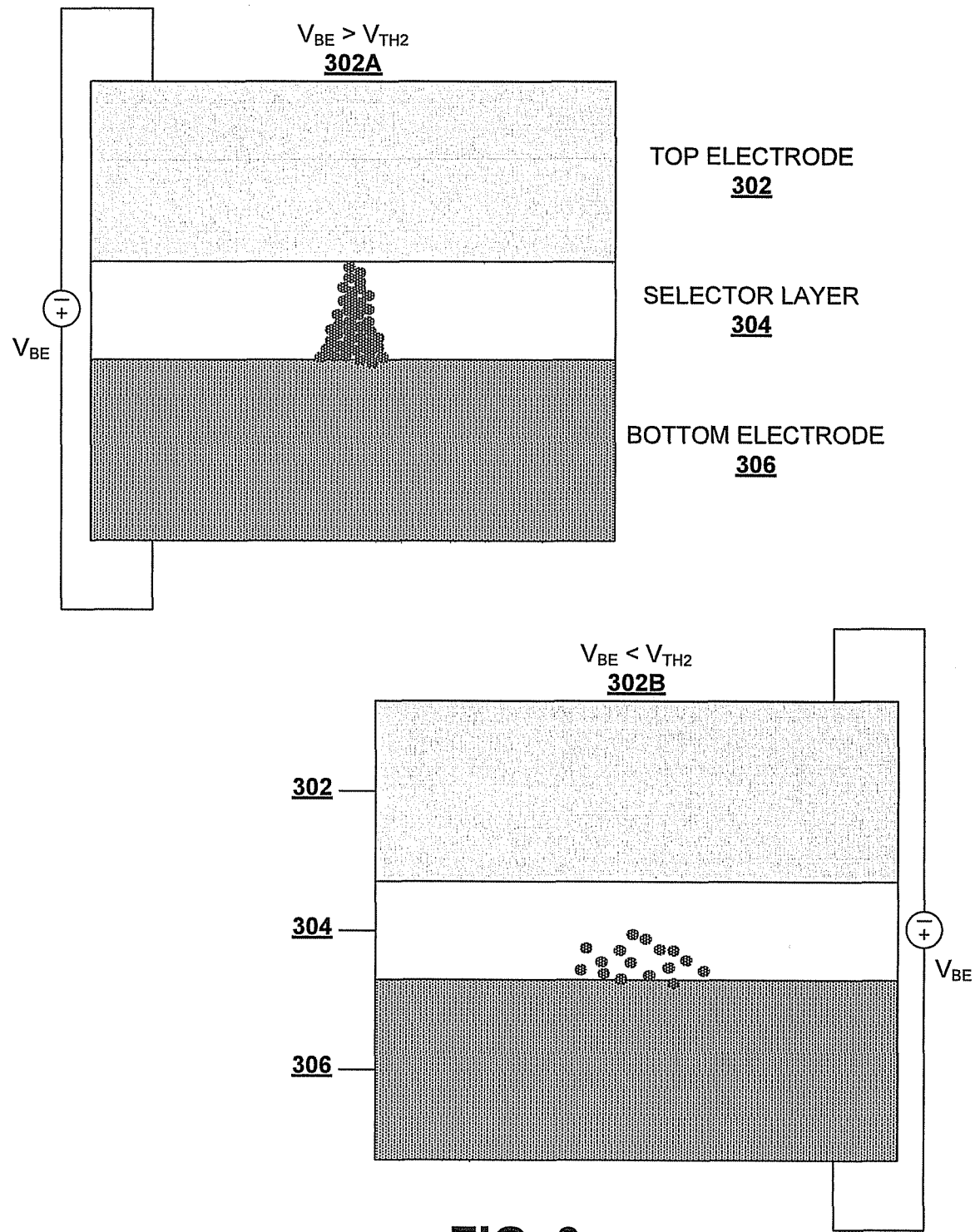
FIG. 3 depicts a block diagram of a sample selector device behavior in response to an electrical characteristic of a second polarity.

FIG. 3 illustrates a block diagram depicting operational behavior of an example selector device 300 according to further aspects of the subject disclosure. Selector device 300 can be substantially similar to selector device 100 or selector device 200, in one or more embodiments. However, the subject disclosure is not so limited.

Operational behavior of selector device 300 is illustrated in response to signals of a second polarity, different from the first polarity of first signal 202A and second signal 202B, described with respect to FIG. 2, supra. For instance, the second polarity can be opposite or approximately opposite the first polarity, in various embodiments. As an illustrative example, the second polarity can comprise a signal gradient (e.g., voltage gradient, current gradient, joule heating gradient, etc.) that is greater value measured from bottom electrode 306 and lesser value measured from top electrode 302.

At the top of FIG. 3, a first signal 302A having magnitude equal to or greater than a second threshold magnitude (or second range of threshold magnitudes, as suitable) is applied at bottom electrode 306 relative to top electrode 302. Particles of bottom electrode 306 migrate within and through a selector layer 304 in response to first signal 302A. The second threshold magnitude is associated with suitable formation of a conductive path(s) across selector layer 304, from bottom electrode 306 to top electrode 302, to induce a conductive state for selector device 300. Note that in some embodiments, the second threshold magnitude (or range of magnitudes) can be different (different values) from the first threshold magnitude (or range of magnitudes) associated with formation of conductive path(s) from top electrode 202 relative to bottom electrode 206 as depicted by FIG. 2, supra. Difference in magnitude can occur, for instance, where the top electrode and bottom electrode are formed of different materials having different particle mobility, different ion strength, different size, different shape, or the like. Said differently, employing different materials, sequences of materials (e.g., adding an addition layer—such as a barrier layer—between selector layer 304 and top electrode 302, or bottom electrode 306), material properties or characteristics for top electrode 302 or bottom electrode 306 can lead to different threshold voltages associated with filament formation from top electrode 202 to bottom electrode 206 (as depicted in FIG. 2) as compared with filament formation from bottom electrode 306 to top electrode 302 (as depicted in FIG. 3).

As depicted by FIG. 3, formation of the conductive path(s) can comprise suitable particles of bottom electrode 306 migrating through selector layer 304, from bottom electrode 306 to top electrode 302, or pre-existing metal particles in selector layer 304 aligning/migrating to form the conductive path(s) (e.g., where the selector layer is doped with metal particles). At the bottom of FIG. 3, a second signal 302B having magnitude less than the second threshold magnitude (or range of magnitudes) is applied at bottom electrode 306. In response to the second signal, particles of the conductive path(s) disperse through selector layer 304 (or toward/into bottom electrode 306), at least in part deforming the conductive path(s). This induces a non-conductive state for selector device 300. Thus, in one embodiment below the lowest threshold magnitude from a narrow range of magnitudes, the conductive path(s) is at least in part deformed, whereas at or above the highest threshold magnitude from the narrow range of magnitudes, the conductive path(s) can be formed sufficiently enough to cause the conductive state for selector device 300. To reiterate the above, in various embodiments herein, it should be understood that reference to a threshold voltage may actually refer to a set of threshold voltages (from a narrow range of voltages) depending on whether a conductive path is formed or deformed.

In other embodiments, if polarity of the voltage source is defined as positive to negative relative to top electrode 302 and bottom electrode 306, below the lowest threshold magnitude from a narrow range of magnitudes, the conductive path(s) can be formed sufficiently enough to cause the conductive state for selector device 300, whereas at or above the highest threshold magnitude from the narrow range of magnitudes, the conductive path(s) is at least in part deformed. Examples of this will be illustrated, below.

In various embodiments, selector device 300 can have the properties described above with respect to selector device 200 in response to a signal of the first polarity. Thus, selector device 300 can form a conductive path(s) comprising particles from top electrode 302 extending through selector layer 304 in response to a signal of the first polarity, and can form a second conductive path(s) comprising particles from bottom electrode 306 extending through selector layer 304 in response to a signal of the second polarity. In at least some embodiments, the conductive path can at least in part comprise particles of bottom electrode 306 (e.g., near to a boundary of bottom electrode 306), and likewise the second conductive path can at least in part comprise particles of top electrode 302 (e.g., near to a boundary of top electrode 302). Thus, selector device 300 can have a first threshold magnitude to facilitate transition to a first conducting state along the first polarity, and a second threshold magnitude to facilitate transition to a second conductive state along the second polarity. This operation can be implemented in conjunction with a bipolar memory cell, providing non-linear I-V characteristics for first polarity signals as well as for second polarity signals. In pragmatic terms, bidirectional non-linear I-V characteristics can facilitate resistance to leakage currents from either positive or negative polarity signals. Thus, the series combination of selector device 300 and a two-terminal memory cell can mitigate leakage current resulting from a programming signal or read signal (e.g., having a first polarity) or an erase signal (e.g., having the second polarity). In at least some embodiments, it should be appreciated that this description of selector device 300 (and other suitable descriptions for FIG. 3), can have analogous applicability to selector device 200 of FIG. 2, supra. Also, the reverse is true; illustrative embodiments described with respect to selector device 200 can be applicable to selector device 300 in suitable embodiments. Accordingly, the example embodiments described for FIGS. 3 and 2 should be considered interchangeable, where suitable.

In various embodiments, selector device 300 can be operated within a set of operational parameters. In some embodiments, the set of operational parameters can be selected to maintain volatile state-switching of selector layer 304 (e.g., by forming a relatively weak filament, which at least in part deforms below a threshold signal magnitude), provide switching longevity, achieve a target power consumption, or the like, or a suitable combination thereof. In some embodiments, current through selector device 300 (and, e.g., the series combination of selector device 300 and a two-terminal memory cell) can be limited to a maximum current value. For instance, the maximum current value can be limited to 300 microamps (μA) or below, 300 μA or below, or another suitable maximum value. In other embodiments, selector layer 304 can have a thickness maintained within a target range of thicknesses. For example, the thickness of selector layer 304 can be from about 0.5 nanometers (nm) to about 50 nm. In various embodiments, based upon current experimental data, typical thicknesses which provide surprisingly effective results based upon a threshold voltage of about 1 volt may be within a range of about 1 to about 20 nm, and more specifically about 1 nm to about 10 nm. In at least one embodiment, the thickness of selector layer 304 (or, e.g., selector layer 204 of FIG. 2, infra) can be selected to provide a signal threshold magnitude (e.g., voltage threshold, current threshold, field strength threshold, etc.) associated with state-switching of selector device 300 to have a target value, or be within a target range. As one illustrative example, the thickness can be selected to provide a threshold voltage associated with state-switching to be between about 0.1 volts and about 4 volts. Maintaining the threshold voltage at a target value can mitigate or avoid formation of a non-volatile filament.

In some embodiments, a stoichiometric value(s) of material utilized for selector layer 304 (or selector layer 204) can be provided at a target value. For instance, a stoichiometric value for 'x' for a SiOx selector layer 304 (or selector layer 204) can be between about 0.5 and about 2. In at least one embodiment, the stoichiometric value can be selected to achieve a target width for a conductive path (e.g., filament) through selector layer 304 (or selector layer 204). In some embodiments, increasing stoichiometric value(s) of the material utilized for selector layer 304 (or selector layer 204) can reduce defect density of selector layer 304 or 204 (e.g., density of dangling bonds, density of particle voids, and so forth), and the stoichiometric value can be selected to achieve a target defect density to provide the target width for the conductive path. In at least one disclosed embodiment, selector layer thickness and stoichiometric value can be respectively selected to achieve a target trade-off between maximum threshold voltage and maximum defect density.

Figure 4:
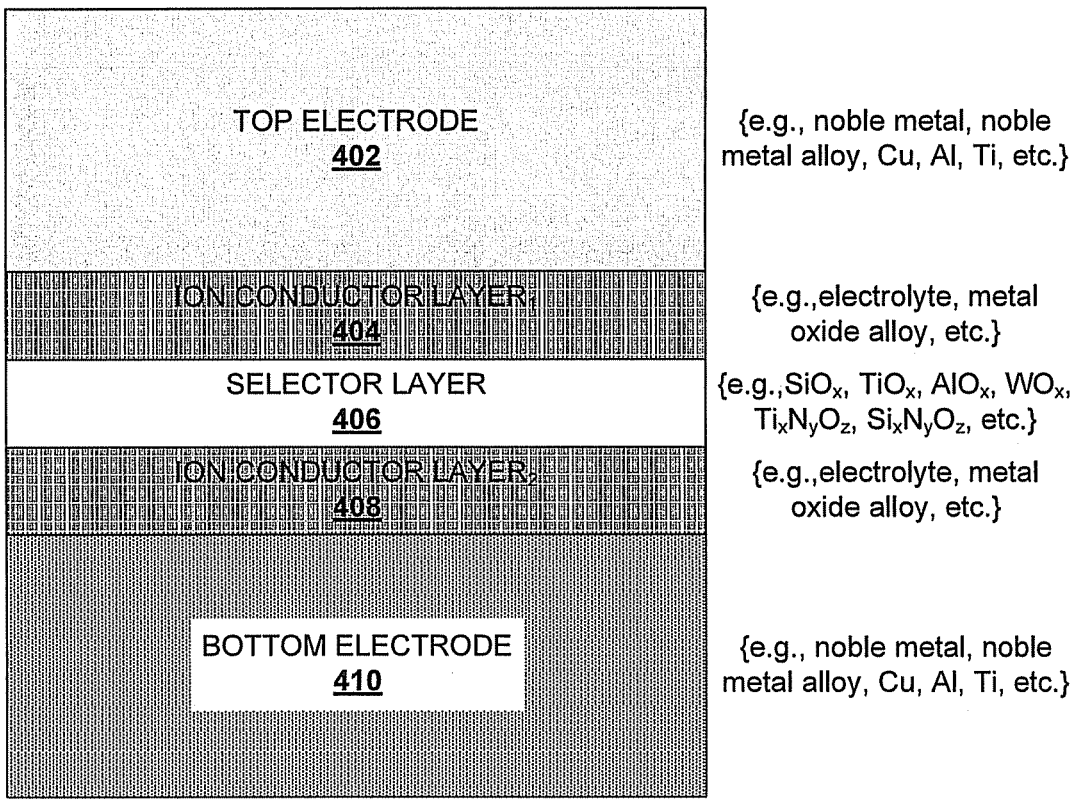
FIG. 4 illustrates a block diagram of a sample selector device according to alternative or additional aspects of the present disclosure.

FIG. 4 illustrates a block diagram of an example solid state switching device 400 according to alternative or additional aspects of the present disclosure. Solid state switching device 400 can be configured to operate as a volatile switching device in series with a two-terminal memory device, in one or more embodiments. In other embodiments, solid state switching device 400 can be configured to operate as a stand alone solid state electronic component, such as a volatile switch, or as an electronic component in conjunction with one or more other electronic devices (e.g., operable in conjunction with one or more CMOS devices fabricated in or on a CMOS substrate).

As depicted, solid state switching device 400 can comprise a top electrode 402, an ion conductor layer$_1$ 404, a selector layer 406, an ion conductor layer$_2$ 408 and a bottom electrode 410. In various alternative embodiments, solid state switching device 400 can comprise one or another of ion conductor layer$_1$ 404 or ion conductor layer$_2$ 408, rather than both. In alternative or additional embodiments, top electrode 402, selector layer 406 and bottom electrode 410 can be substantially similar to the similarly named layers of FIGS. 3 and 2, supra, however the subject disclosure is not so limited, and different materials or characteristics can be associated with selector layer 406—selected for suitability when selector layer 406 is adjacent to ion conductor layer$_1$ 404 or ion conductor layer$_2$ 408—within the scope of the present disclosure.

Top electrode 402 or bottom electrode 410 can comprise a noble metal, a suitable metal alloy containing noble metal in part, a fast diffusing material (e.g., Cu, Al, Ti, Co, Ni, Ag, etc.) or suitable alloys of the fast diffusing metal, or the like, or a suitable combination thereof. In various embodiments, top electrode 402 or bottom electrode 410 can be an active metal, whereas in other embodiments top electrode 402 or bottom electrode 410 can be an integrated circuit wiring metal (e.g., W, Al, Cu, TiN, TiW, TaN, WN, and so forth). In some embodiments, top electrode 402 and bottom electrode 410 can be the same material; in other embodiments, top electrode 402 and bottom electrode 410 can be different materials.

Further to the above, solid state switching device 400 can comprise a selector layer 406. Selector layer 406 can comprise an electrically resistive material that is weakly permeable to ions of top electrode 402 or bottom electrode 410. Weak permeability can facilitate reliable deformation or dispersion of conductive ions within selector layer 406, in response to a signal below a threshold magnitude, as described herein. In other words, weak permeability can facilitate volatile formation and deformation of a conductive path(s) within selector layer 406.

Further to the above, solid state switching device 400 can comprise ion conductor layer$_1$ 404 and ion conductor layer$_2$ 408. Ion conductor layer$_1$ 404 or ion conductor layer$_2$ 408 can comprise a solid electrolyte (e.g., Ag—Ge—S, Cu—Ge—S, Ag—Ge—Te, Cu—Ge—Te, GeSb, etc.), a metal-oxide alloy (e.g., AgSiO$_2$, CuAl2Ox, and so forth). In some embodiment, solid state switching ion conductive layer$_1$ 404 can depend at least in part on a diffusivity metric of ions of top electrode 402. In another embodiment, presence of ion conductive layer$_2$ 408 can depend at least in part on a diffusivity metric of ions of bottom electrode 410. In further embodiments, ion conductor layer$_1$ 404 or ion conductor layer$_2$ 408 can be selected to yield faster ion generation (hence faster switching or lower voltage switching) for selector layer 406 as compared with top electrode 402 or bottom electrode 408.

Figure 5:
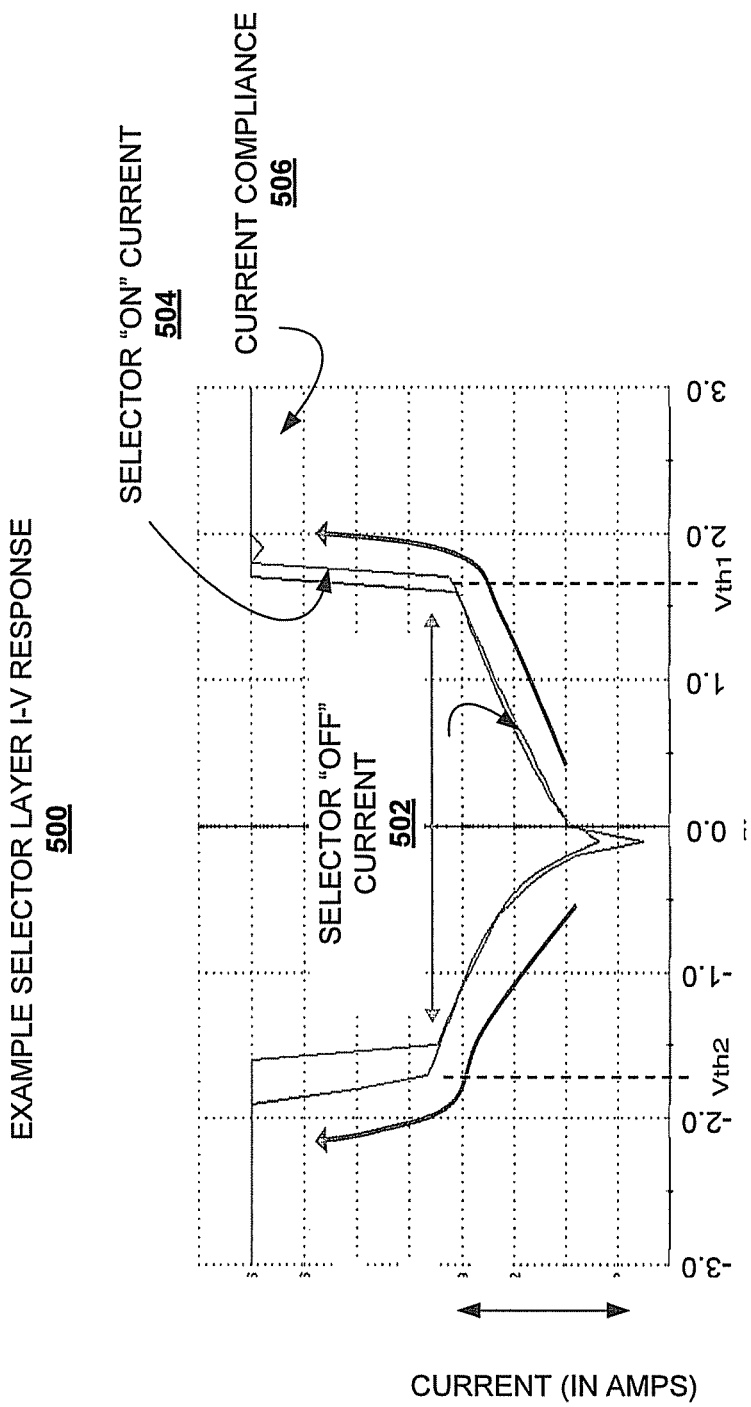
FIG. 5 depicts a diagram of an example current-voltage (I-V) response of a selector device, in some embodiments.

FIG. 5 illustrates a diagram of an example electrical response 500 for a selector device according to one or more additional embodiments described herein. Particularly, electrical response 500 can be associated with a selector layer of a selector device described herein. As depicted, a vertical axis of electrical response 500 depicts current (in Amps [A]) conducted across the selector device (e.g., from a top electrode to a bottom electrode), and a horizontal axis of electrical response 500 depicts a voltage (in Volts [V]) applied across the selector device. Note that the left side of the horizontal axis is negative voltage and the right side of the horizontal axis is positive voltage (measured at the top electrode, for example).

A sharp non-linear inflection point in current value occurs approximately at a positive threshold voltage Vth$_1$ and approximately at a negative threshold voltage Vth$_2$. In some embodiments, positive threshold voltage Vth$_1$ can have substantially the same or the same voltage magnitude as negative threshold voltage Vth$_2$. In other embodiments, however, positive threshold voltage Vth$_1$ can have a different magnitude from negative threshold voltage Vth$_2$.

In various embodiments, the blue arrow labeled selector "off" current 502 indicates the inflection point in current, below which current drops off more slowly versus voltage and above which current increases very quickly with increasing voltage, up to a current compliance level 506 (e.g., that was set by a tester or external input). The selector "on" current 504 is achieved at slightly higher voltage than Vth$_1$ or Vth$_2$. In the example in FIG. 5, between 0 and about 1.5 volts, the off-state current is illustrated to be lower than about 1E-9 amps. In other experiments, lower off-state currents have been achieved, for example, lower than 1E-10 amps, lower than 1E-11 amps, or the like in embodiments with inflection point voltages of approximately 1 volt.

As mentioned above, Vth1 may be similar or different from Vth2. Further, the amount of current associated with the inflection point in the reverse polarity (e.g. V<0) may be different from the current associated with the inflection point for V>0. In the example in FIG. 5, the off-state current may be lower than about 5E-9. In other experiments, lower off-state currents have been achieved, for example, lower than 1E-10 amps, lower than 1E-11 amps, or the like in embodiments with inflection point voltages of approximately −0.5 volt. In various embodiments, electrical response 500 can be characterized by a relatively steep change in current as a function of voltage, upon voltage meeting or exceeding an upper range for $Vth_1$ and prior to current compliance, compared to voltage less than a lower range for $Vth_1$ ($Vth_1$ referring to a narrow range of voltages). For instance, electrical response 500 can have a current increase measured as a function of current decade (e.g., an order of magnitude change in current) per voltage, or $I_{DECADE}/V$, or as a function of voltage per current decade, $V/I_{DECADE}$. In some embodiments, electrical response 500 can increase between about 3.5 decades and about 4 decades per 100 milliVolts (mV), or between about 0.035 decades/mV and about 0.04 decades/mV, for a subset of voltages that are equal to or greater than $Vth_1$.

Alternatively, electrical response 500 can be characterized by a change between about 25 and about 29V/decade between the lowest value of Vth and the highest value of Vth. In other embodiments, electrical response 500 can have an electrical response 500 (e.g., in response to a negative voltage) of between about 0.030 decades/mV and about 0.040 decades/mV for a subset of negative voltages that are equal to or less than $Vth_2$. Stated differently, electrical response 500 can be between about 25 mV/decade and about 33 mV/decade for a subset of voltages that are within the range of $Vth_2$. In other experiments, the electrical response has been measured to be about 17 mV/decade (a Vth range of about 100 mV over 6 decades) or about 0.06 decades/mv. In such embodiments, the nominal Vth value is on the order of about 1 volt. In light of the present disclosure, electrical responses 500 within a range of about 10 mV/decade to about 100 mV/decade are now achievable. Further, electrical responses on the order of 0.1 mV/decade to about 0.01 mV/decade are now believed to be enabled.

Nominal threshold voltage magnitudes for electrical response 500 are between about 1.5 volts and about 2 volts in magnitude. In some embodiments, the nominal threshold voltage magnitudes can be between about 1.5 volts and about 1.8 volts in magnitude. For these ranges of threshold voltages, in FIG. 5, a difference in magnitude of selector "off" current 502 and selector "on" current 504 is about four orders of magnitude (e.g., $1 \times 10^4$, or 10,000) for positive voltages, and about three and a half orders of magnitude (e.g., $5 \times 10^3$, or 5,000) for negative voltages. In an embodiment with lower threshold voltages $Vth_1$ and $Vth_2$, a much higher difference in magnitude of selector "off" current 502 versus selector "on" current 504 can be achieved. For example, in embodiments where the nominal threshold voltage $Vth_1$ is approximately 1.1 volts, the electrical response is about 16 mV/decade.

In various embodiments, electrical response 500 can vary for different selector devices. For instance, variation in materials employed for a selector device can result in variations in electrical response 500, including selector "off" current 502, selector "on" current 504 and positive and negative threshold voltages. In another embodiment, thickness of a selector material layer can additionally affect electrical response 500. Accordingly, a target electrical response 500 can to some extent be achieved by selecting a suitable top electrode material, selector layer material or thickness, or bottom electrode material for a disclosed selector device.

Figure 6:
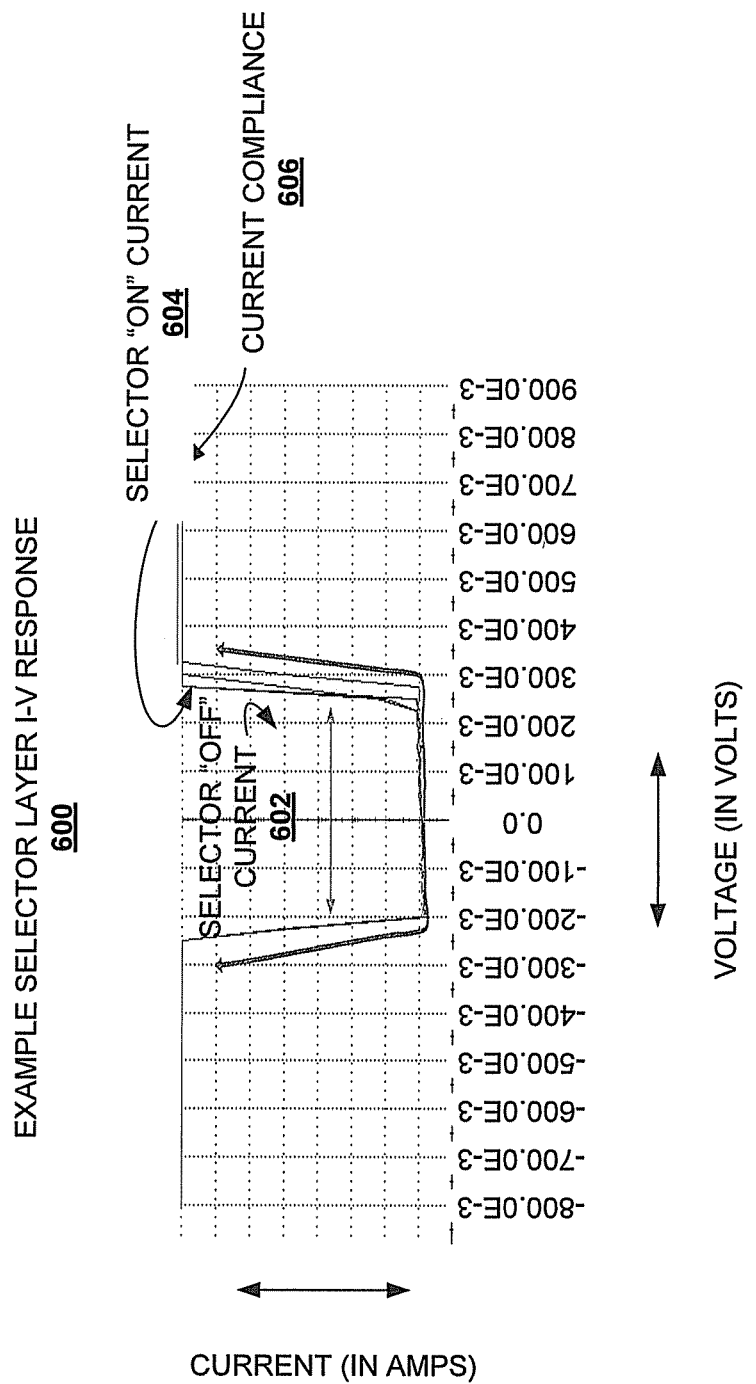
FIG. 6 depicts a diagram of a sample I-V response of a selector device in other disclosed embodiments.

FIG. 6 depicts a diagram of an electrical response 600 for a selector device according to additional embodiments of the subject disclosure. A vertical axis of electrical response 600 displays current (A) conducted by the selector device, and a horizontal axis of electrical response 600 displays voltage (V) applied across the selector device. A selector "off" current 602 is illustrated with very sharp non-linear response, from about $1 \times 10^{-11}$ amps ($10.0 \times 10^{-12}$) to about $1 \times 10^{-4}$ amps ($100.0 \times 10^{-6}$) with an on/off ratio within a range of about 6 to about 10 orders of magnitude, for a selector "on" current 604, at current compliance 606. In one example, a current ratio of "on" current to "off" current of seven orders of magnitude, or a ratio of 10,000,000 is achieved. This ratio is achieved at a nominal positive threshold voltage, or $Vth_1$, of just under 300 millivolts, and a nominal negative threshold voltage, or $Vth_2$, of about −200 millivolts. By utilizing a selector device 600 with suitable selector and top electrode or bottom electrode material(s), a smaller ratio of "on" current to "off" current can be achieved. For instance, in one embodiment, a current ratio in a range of 1,000,000 to about 10,000,000 can be achieved. In another embodiment, a current ratio in a range of about 100,000 to about 1,000,000 can be achieved. In yet another embodiment, a current ratio in a range of about 10,000 to about 100,000 can be achieved. In still another embodiment, a current ratio in a range of about 1,000 to about 10,000 can be achieved. In at least one disclosed embodiment, a current ratio equal to about 100,000 or larger can be achieved. In at least one further embodiment, a current ratio as large as about $10.0 \times 10^{-9}$ can be achieved.

Electrical response 600 can also be characterized by increase in current as a function of voltage, or vice versa. For a subset of voltages equal to or greater than $Vth_1$, electrical response 600 can have an electrical response 600 between about 3.5 mV/decade and about 14 mV/decade in an embodiment. In another embodiment, electrical response 600 can have an electrical response 600 between about 0.07 decades/mV and about 0.25 decades/mV for the subset of voltages equal to or greater than $Vth_1$. In further embodiments, for a second subset of voltages equal to or less than $Vth_2$, electrical response 600 can be between about 7 mV/decade and about 7.5 mV/decade. In another embodiment, for the second subset of voltages, electrical response 600 can be between about 0.15 decades/mV and about 0.12 decades/mV. In at least one additional example, electrical response of a disclosed selector device can be about 1.5 mV/decade, or about 0.7 decades/mV. In a further embodiment, the electrical response can be selected from a range of about 1 mV/decade and about 60 mV/decade. In yet another embodiment, the electrical response can be selected from a range of about 1 decade/mV and about 0.15 decades/mV.

Figure 7:
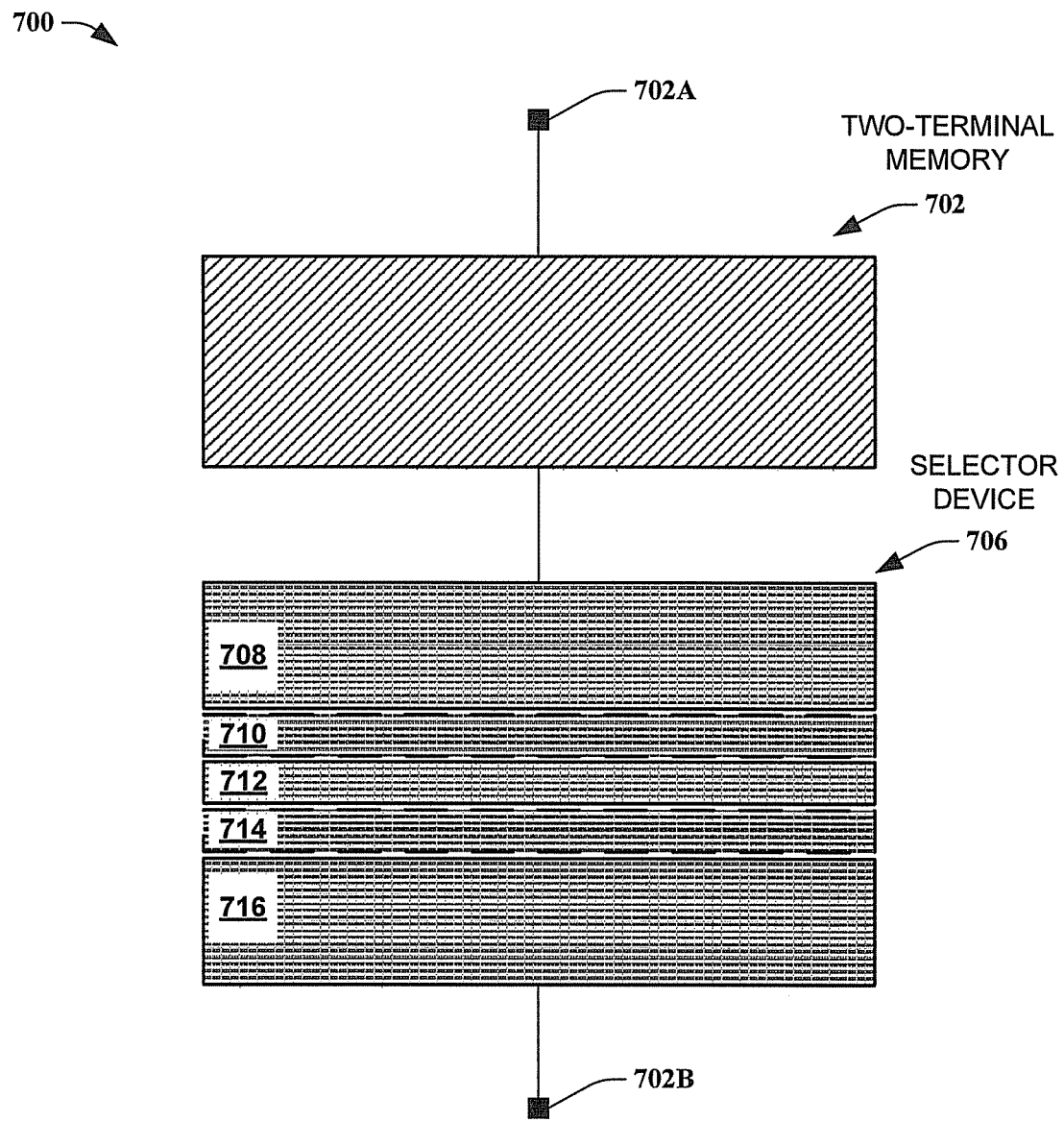
FIG. 7 depicts a block diagram of an example selector device provided in conjunction with a memory device, according to an embodiment(s)

FIG. 7 illustrates a block diagram of an example memory device 700 according to further embodiments of the present disclosure. Memory device 700 can comprise a two-terminal memory component 702 electrically in series with a selector device 706. Additionally, memory device 700 can comprise a first terminal 702A and a second terminal 702B for applying an operation signal across memory device 700 (e.g., a read signal, an erase signal, a program signal, a rewrite signal, and so forth).

Memory device 700 can be a non-volatile, two-terminal switching element. Examples can include a resistive memory, a resistive-switching memory such as a resistive random access memory (RRAM), a phase-change memory (PCRAM), a magneto-resistive memory (MRAM), a ferroelectric memory (FeRAM), organic memory (ORAM), conductive bridging memory (CBRAM), one-time programmable memory (OTP) or the like. In particular embodiments, memory device 700 can be a bipolar memory device. Accordingly, memory device 700 can be programmed or written in response to a signal(s) of a first polarity. Further, memory device 700 can be erased in response to a signal(s) of a second polarity. According to various embodiments, selector device 706 can be configured as a bipolar switching device. In such embodiments, selector device 706 can be switched from a non-conducting state to a conducting state in response to a signal of the first polarity exceeding a first polarity threshold magnitude, $threshold_1$ (e.g., a first polarity threshold voltage $Vth_1$, and so on). Further, selector device 706 can be switched from the non-conducting state to the conducting state in response to a second signal of the second polarity exceeding a second polarity threshold magnitude, $threshold_2$ (e.g., a second polarity threshold voltage $Vth_2$, or the like).

In various embodiments, selector device 706 can have a greater electrical resistance in the non-conducting state than an associated off-state (e.g., erased state) electrical resistance of two-terminal memory component 702. Likewise, selector device 706 can have a greater electrical conductivity in the conducting state than an associated on-state (e.g., program state) electrical conductivity of two-terminal memory component 702. Accordingly, selector device 706 can serve as an activation/deactivation component for memory device 700, resisting memory operations at two-terminal memory component 702 when in a non-conducting state, and enabling memory operations at two-terminal memory component 702 when in a conducting state. For embodiments in which two-terminal memory component 702 and selector device 706 are bipolar switching devices, the activation/deactivation effect of selector device 706 can occur in response to signals of a first polarity (e.g., read signals, program signals, etc.) as well as signals of a second polarity (e.g., erase signals, and so forth).

In at least one embodiment, activation/deactivation of memory device 700 can be characterized by a voltage divider arrangement. For instance, when in the off-state, selector device 706 can be selected to have a suitably larger resistance than two-terminal memory component 702. Therefore, when in the off-state, selector device 706 can be configured to drop most of a voltage applied between the two end terminals 702A and 702B, thereby insulating two-terminal memory component 702 from a voltage suitable for programming, erasing or reading two-terminal memory component 702. A voltage above the first polarity threshold magnitude will turn selector device 706 to the on-state, lowering resistance of selector device 706 to a lower resistance than two-terminal memory component 702. This enables a signal applied to memory device 700 to affect two-terminal memory component 702. For the embodiments in which selector device 706 is a bipolar device, selector device 706 can respond similarly with respect to a signal of the second polarity below the second polarity threshold magnitude (insulating two-terminal memory component 702 from such a signal) or above the second polarity threshold magnitude (exposing two-terminal memory component 702 to such signal), as described above with respect to signals of the first polarity. In some embodiments, however, selector device 706 can respond at least in part differently for first polarity and second polarity signals. As one example, selector device 706 can have a different first threshold magnitude in response to first polarity signals, as compared with second threshold magnitude in response to second polarity signals. In another example, selector device 706 can have a different non-linear response to first polarity signals as compared with an associated non-linear response to second polarity signals, or the like, or suitable combinations thereof.

The inventors of the present disclosure believe that memory device 700 can provide significant advantages over other proposed or theorized mechanisms for providing high density memory for advanced technology nodes. As described herein, selector device 706 can provide a non-linear I-V response for a two-terminal memory component 702. The non-linear response can greatly mitigate leakage current (e.g., see FIG. 9, infra) for 1T-nR memory arrays having large values for n (e.g., where n is 512, 1024, or even larger).

In addition, selector device 706 can provide significant advantages over other non-linear electronic components, such as a solid state diode. As one example, selector device 706 can be fabricated at relatively low temperature, whereas solid state diodes generally require higher than 500 degrees Celsius (° C.). High temperatures can prevent back-end device fabrication on top of an integrated circuit (e.g., back end of line processing), where such temperatures exceed a thermal budget of the integrated circuit. Selector device 706 can be fabricated within thermal budgets of many integrated circuits, whereas solid state diodes generally cannot. In some embodiments, selector device 706 can be fabricated below 400° C.; in other embodiments, selector device 706 can be fabricated below 300° C.; in still other embodiments selector device 706 can be fabricated as low as 200° C. or even lower. These temperatures can enable the back-end fabrication of memory device 700 on many integrated circuits comprising pre-fabricated CMOS devices, silicon on insulator (SoI) devices, or the like, or suitable combinations thereof (e.g., see FIG. 8, infra).

In addition to the foregoing, solid state diodes may not be fabricated or operated reliably at 22 nm technology nodes or below. In contrast, selector device 706 can operate for 22 nm technology nodes in some embodiments; in additional embodiments selector device 706 can operate for 14 nm technology nodes; in still other embodiments selector device 706 can operate for 10 nm technology nodes, 7 nm technology nodes or 5 nm technology nodes, etc. (or suitable half-nodes smaller than 22 nm). Furthermore, solid state diodes generally do not operate in a bipolar fashion, switching from high resistance to low resistance in response to positive polarity signals and negative polarity signals. Accordingly, solid state diodes cannot generally be used with bipolar memory for rewritable memory applications. Selector device 706 is not so limited, and can provide non-linear characteristics for bipolar memory, facilitating non-linear I-V response for program or read signals of a first polarity, in addition to non-linear I-V response for erase signals of a second polarity. Further to the above, selector device 706 can be utilized in a three-dimensional array of memory devices 700, in addition to two-dimensional arrays, providing much greater memory densities than technologies limited to two-dimensional arrays.

In an alternative or additional embodiment of the present disclosure, selector device 706 can comprise a selector material associated with a first current in response to an applied voltage less than a threshold voltage associated with selector device 706. Further, the selector material can be associated with a second current in response to an applied voltage greater or equal to the threshold voltage. A ratio of the second current to the first current can be selected from a range of ratios from about 1,000 to about 10,000, in an embodiment(s). In another embodiment(s), the ratio of the second current to the first current can be selected from a range of ratios from about 10,000 to about 100,000. In yet another embodiment(s), the ratio of the second current to the first current can be selected from a range of ratios from about 100,000 to about 1,000,000. According to a further embodiment(s), the ratio of the second current to the first current can be selected from a range of ratios from about 1,000,000 to about 10,000,000.

According to other disclosed embodiments, selector device 706 can comprise a top electrode 708 comprised of a first metal, and a bottom electrode 716 comprised of a second metal. In various embodiments, the first metal can be similar to the second metal; whereas in at least one embodiment the first metal can be the same as the second metal. In further embodiments, the first metal or second metal can be selected from a group consisting of: an active metal, W, Al, Cu, TiN, TaN, WN, and TiW. In another embodiment(s), selector device 706 can comprise a first ion conductor 710 or a second ion conductor 714. In an embodiment(s), first ion conductor 710 or second ion conductor 714 can be selected from a group consisting of: an ion conductor, an electrolyte (e.g., a solid electrolyte), a chalcogenide, a metal oxide, and a metal oxide alloy.

According to additional embodiments, selector device 706 can comprise a selector layer 712. Selector layer 712 can comprise a selector material configured to allow conductive ions to permeate within the selector material of selector layer 712 in response to a voltage across top electrode 708 and bottom electrode 716. In further embodiments, the selector material can comprise a material selected from a group consisting of: an insulator, a non-stoichiometric oxide, a solid electrolyte, a chalcogenide, and a metal-doped material.

According to another embodiment(s), selector device 706 can have a threshold voltage of a first polarity or a second threshold voltage of a second polarity that is about one half of a program voltage of two-terminal memory component 702. In such embodiment(s), a read voltage of the two-terminal memory component 702 can be smaller than the program voltage and larger than the threshold voltage of the first polarity or the second threshold voltage of the second polarity.

Figure 8:
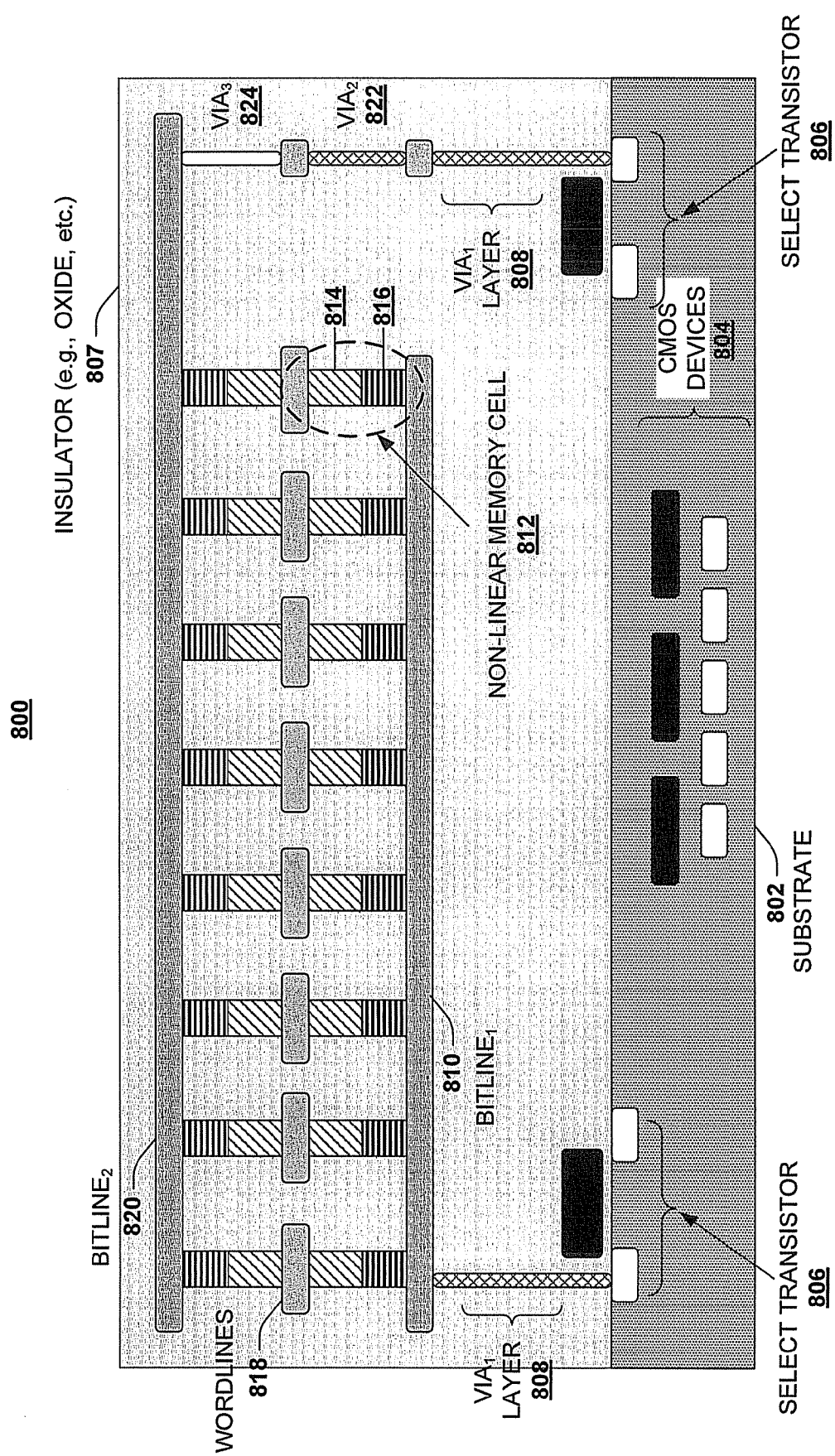
FIG. 8 illustrates a block diagram of an example arrangement of memory cells comprising respective selector devices in series with two-terminal memory.

FIG. 8 illustrates a block diagram of a side view of an example memory architecture 800 comprising multiple arrays of two-terminal memory devices configured to mitigate leakage current on a conductor of the array, according to one or more embodiments of the subject disclosure. In some embodiments, memory architecture 800 can facilitate improved memory densities even at advanced technology nodes (e.g., 22 nm and below). In other embodiments, memory architecture 800 can facilitate fabrication of high capacity, fast switching and high longevity memory monolithically integrated with an integrated circuit comprising prefabricated electronic components, at very low fabrication costs.

As depicted, memory device 800 can comprise a substrate 802. Substrate 802 can be a silicon wafer, or other suitable insulated semiconducting material utilized for fabrication of one or more electronic devices 804 on, within or partially within substrate 802 (e.g., where the electronic devices 804 can include electronic devices, SoI devices, or the like, or a suitable combination thereof). In the example of FIG. 8, electronic devices 804 can be at least in part formed within substrate 802. Although electronic devices 804 are illustrated as being wholly within substrate 802, it should be appreciated that electronic devices 804 can be constructed at least in part on or above substrate 802 (e.g., front-end-of-line process layers). For instance, one or more electronic devices 804 can comprise a transistor having a source or drain contact formed within substrate 802, and a floating gate, or the like, in a layer above substrate 802. The one or more electronic devices 804 may be driver circuits, logic circuits, processing devices, array logic, or the like. Back-end of line processes can be formed within, or interspersed among, one or more insulator 807 layers. Back-end of line processes can comprise conductive layers, memory layers (e.g., resistive-switching layers, or other suitable two-terminal memory active region layer), selector layers, barrier layers, electrical contact layers, insulator layers, or the like, or suitable combinations thereof.

Memory device 800 can comprise one or more select transistor(s) 806 for activating or deactivating memory cells 812 of memory device 800. Select transistor 806 can be connected through a first via layer, $via_1$ 808, to a first bitline, $bitline_1$ 810 associated with memory cells 812. When select transistor 806 is activated, a suitable signal (e.g., program signal, read signal, erase signal, etc.) can be applied through $via_1$ 808 to $bitline_1$ 810. $Bitline_1$ 810 in turn is connected to respective first contacts of a first set of memory cells 812 (the lower set of memory cells depicted at FIG. 8). Deactivation of select transistor 806 can isolate $bitline_1$ 810 from the operation signal, resisting electrical current on $via_1$ 808. Thus, select transistor 806 can serve as the 1T transistor in a 1T-nR memory architecture, where n is defined by a number of memory cells 812 activated by select transistor 806.

Memory cells in the first (lower) array have respective first contacts connected to $bitline_1$ 810, and respective second contacts connected to respective ones of wordlines 818. Note that respective memory cells 812 comprise a selector component 814 in electrical series with a memory component 816. Memory component 816 can comprise a two-terminal switching device (e.g., resistive memory, phase-change memory, magneto-resistive memory, and so forth), such as described with respect to two-terminal memory component 702 of FIG. 7, supra. Likewise, selector component 814 can comprise a selector device as described herein (e.g., see FIGS. 1, 2, 3, 4, 7, supra), having one or more electrodes, a selector layer and optionally one or more ion conductor layers.

Additionally, it should be appreciated that the orientation of selector component 814 and memory component 816 can be reversed; for instance, the first array of memory cells 812 depicts selector component 814 below memory component 816, however a second array (top array) of memory cells 812 depicts selector component 814 above memory component 816. It should be appreciated that memory cells 812 are not limited to the depicted arrangement; in an alternative embodiment, memory cells 812 can uniformly have respective selector components 814 below respective memory components 816; other embodiments can uniformly have respective selector components 814 above respective memory components 816; still other embodiments can have a combination of the foregoing, and further embodiments can comprise non-uniform orientation of respective selector components 814 and memory components 816 for subsets of memory cells 812.

A second array of memory cells 812 (top array) are connected at respective memory components 816 to respective ones of wordlines 818, and at associated selector components 814 to a second bitline, $bitline_2$ 820. $Bitline_2$ 820 can be activated through a series of vias, including a first layer $via_1$ 806 (activated by a select transistor), a second layer $via_2$ 822 and a third layer $via_3$ 824. In other embodiments, more or fewer vias can be utilized to connect $bitline_2$ 820 with its associated select transistor 806.

In some embodiments, $via_1$ 806, $via_2$ 822, or $via_3$ 824 (referred to collectively as via layers 806, 822, 824) can connect a bitline 810, 820, or a wordline 818, source line, etc. (not depicted), to components of electronic devices 804 or two-terminal switching devices 812, as is known in the art or is made known to one of ordinary skill in the art by way of the context provided herein. Via layers 806, 822, 824 can comprise a metal, a conductive silicon-based material, and so forth. In some disclosed embodiments, via layers 806, 822, 824 or other via layers not depicted can be utilized to form one or more layers of non-linear memory cell 812 (e.g., where one or more layers of memory component 814 or selector component 816 can be fabricated at least in part in conjunction with a via layer 806, 822, 824).

It should be appreciated that memory device 800 can have arrays of memory cells 812 extrapolated in additional dimensions in a two dimension or three dimension array. For instance, memory device 800 can comprise additional arrays of memory cells 812 in and out of the page of FIG. 8. In further embodiments, memory device 800 can have additional layers of bitlines and wordlines above bitline$_2$ 820, with respective arrays of memory cells 812 there between, enabling increased numbers of memory cells 812 in the vertical direction.

Note that memory cells 812 are illustrated as having a vertical arrangement (e.g., memory component 814 above selector component 816), in other embodiments non-linear memory cell 812 can be arranged along an oblique angle. For instance, memory component 816, selector component 814, or a subset of the solid state layers of the foregoing, can be arranged sequentially along a direction that is not perpendicular to a top surface of substrate 802. In at least one embodiment, memory component 814 and selector component 816 can be arranged in a direction that is parallel to, or near parallel to the top surface of substrate 802, or other suitable direction. In such embodiments, wordlines 818 or bitline$_1$ 810 or bitline$_2$ 820 can be re-oriented (e.g., as a film or fill within a via) as suitable to accommodate the oblique orientation.

The inventors of the present disclosure understand that some conventional techniques for fabricating non-linear electronic components can involve quite high temperatures (e.g., 500° C., 600° C., or higher). The inventors understand these high temperature processes are generally incompatible with advanced CMOS processing (e.g., where the maximum allowed process temperature is <370~430C). Thus, the inventors understand that manufacture of a memory device 800 could conventionally require non-monolithic processes. The inventors believe that non-monolithic fabrication can be much more complex, however, requiring higher costs, longer fabrication times, and greater overhead than a monolithic process, for instance. In contrast, monolithic fabrication can merely involve a set of additional masks or etching processes to form non-linear memory cell 812 (or, e.g., interconnect layer(s) 806, via layers 810, 812, or metal conductor(s) 818) on a single integrated chip having electronic devices 804 pre-fabricated therein (or thereon), as one example.

Figure 9:
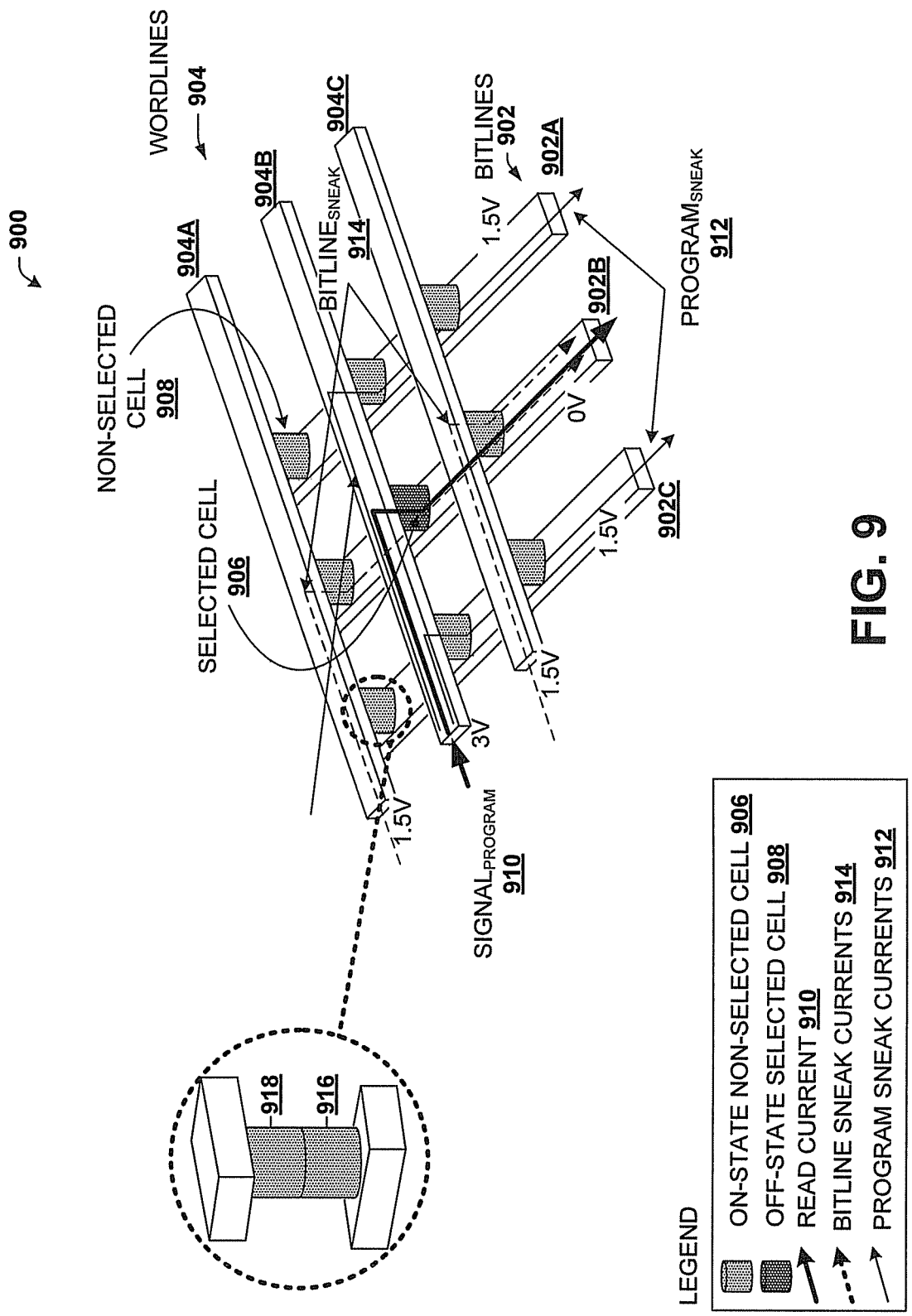
FIG. 9 depicts a diagram of a sample crossbar memory architecture illustrating effects of leakage current and benefit of non-linear I-V response.

FIG. 9 illustrates a block diagram of an example array 900 of memory cells, in additional embodiments of the present disclosure. Array 900 can be a crossbar memory array, as depicted, comprising a first set of conductors, bitlines 902, substantially parallel to a second set of conductors, wordlines 904, with respective two-terminal memory devices at intersections of respective bitlines 902 and wordlines 904. Array 900 illustrates sneak path currents (also referred to herein as leakage currents) caused by a program supply signal applied to a selected one of wordlines 904, in addition to sneak path currents caused by inter-bitline voltage potentials (e.g., capacitive voltages). Array 900 illustrates problems associated with sneak path currents, and therefore is useful to illustrate benefits of non-linear characteristics for two-terminal memory.

As mentioned above, array 900 comprises a set of bitlines 902 substantially perpendicular to a set of wordlines 904. Where respective bitlines 902A, 902B, 902C intersect one of the wordlines 904A, 904B, 904C, a non-linear two-terminal memory cell is positioned, having a first terminal connected to one of bitlines 902 and a second terminal connected to one of wordlines 904. Further, a selected cell 906 is a non-linear two-terminal memory cell targeted for a program operation. Particularly, the program operation includes a program signal 910 of about three volts applied to wordline 904B. In some embodiments, intermediate signals of about 1.5 volts can be applied to non-selected wordlines 904A, 904C, whereas in other embodiments wordlines 904A, 904C can be left floating. Additionally, bitline 902B is driven to zero volts (e.g., to provide a 3 volt potential difference across selected cell 906), whereas bitlines 902A, 902C can be driven to 1.5 volts (or, e.g., can be left floating in at least one embodiment). Capacitive coupling among bitlines 902A, 902C and wordlines 904 will induce a voltage onto bitlines 902A, 902C greater than zero volts and less than three volts.

The program operation voltages can cause multiple sneak path currents; sneak paths caused by signal program 910, referred to as program sneak currents 912, and sneak paths on bitline 902B, referred to as bitline sneak currents 914. Bitline sneak currents 912 are depicted by dashed lines, whereas the program sneak currents 912 are depicted by narrow solid lines. Two paths are depicted for bitline sneak currents 914, through non-selected cells 908 on wordlines 904A, 904C. Each of the bitline sneak currents 914 share bitline 902B as a common component of the respective paths. Program sneak currents 912 propagate through the selected local wordline 904B, to bitlines 902A, 902C, respectively.

Note that program supply current sneak paths on wordlines other than on the selected wordline 904B of memory array 900 are not depicted. If the non-selected wordlines 904A, 904C are allowed to float, capacitive coupling induces a voltage on non-selected wordlines 904A, 904C which can approach 1.5 volts in some embodiments (e.g., depending on inter-wordline capacitance). The sneak paths on these non-selected wordlines can exist but may have only small impact on sensing margins, so are not depicted.

With a non-linear memory cell having I-V response depicted by FIG. 5 utilized for non-selected cells 908 and selected cell 906, the approximately 1.5 volts on bitlines 902A, 902C and wordlines 904A, 904C will be less than the threshold voltage of the selector components of the memory cells (which according to FIG. 5 is above 1.5 volts). Accordingly, the magnitude of sneak path currents in array 900 will be quite small, having negligible effect on sensing margin for selected cell 908, despite the fact that memory components 918 of non-selected cells 908 are in an "on" memory state. This is because selector components 916 of non-selected cells 908 are in a non-conducting state, reducing current through non-selected cells 906 by about four orders of magnitude, despite the fact that memory components 918 of non-selected cells 908 are programmed to a relatively conducting state. In other embodiments, inter-bitline and inter-wordline capacitive coupling effects can be reduced even further (e.g., by utilizing relatively small local wordlines or local bitlines having small capacitance for array 900). Where capacitive coupling effects are reduced (or where program voltage can be reduced) so that floating bitlines 902A, 902C or floating wordlines 904A, 904C have less than about 200 millivolts of voltage each, then a non-linear memory cell having the I-V response of FIG. 6 can be utilized for array 900. In this case, magnitude of sneak path currents can be reduced even more by the respective selector components 916 (e.g., up to about seven orders of magnitude). This large reduction in current can enable quite large numbers, n, of memory cells in a 1T-nR array architecture, while maintaining acceptable sensing margin for selected cell 908. Accordingly, such a 1T-nR architecture can provide very good memory density even for advanced technology nodes (e.g., 22 nm or less).

The aforementioned diagrams have been described with respect to interaction between several components (e.g., layers) of a memory cell, a conductive layer thereof, or a memory architecture comprised of such memory cell/conductive layer. It should be appreciated that in some suitable alternative aspects of the subject disclosure, such diagrams can include those components and layers specified therein, some of the specified components/layers, or additional components/layers. Sub-components can also be implemented as electrically connected to other sub-components rather than included within a parent component/layer. For example, an intermediary layer(s) can be instituted adjacent to one or more of the disclosed layers. As one example, a suitable barrier layer that mitigates or controls unintended oxidation can be positioned between one or more disclosed layers. In yet other embodiments, a disclosed memory stack or set of film layers can have fewer layers than depicted. For instance, a switching layer can electrically contact a conductive wire directly, rather than having an electrode layer there between. Additionally, it is noted that one or more disclosed processes can be combined into a single process providing aggregate functionality. Components of the disclosed architectures can also interact with one or more other components not specifically described herein but known by those of skill in the art.

Figure 10:
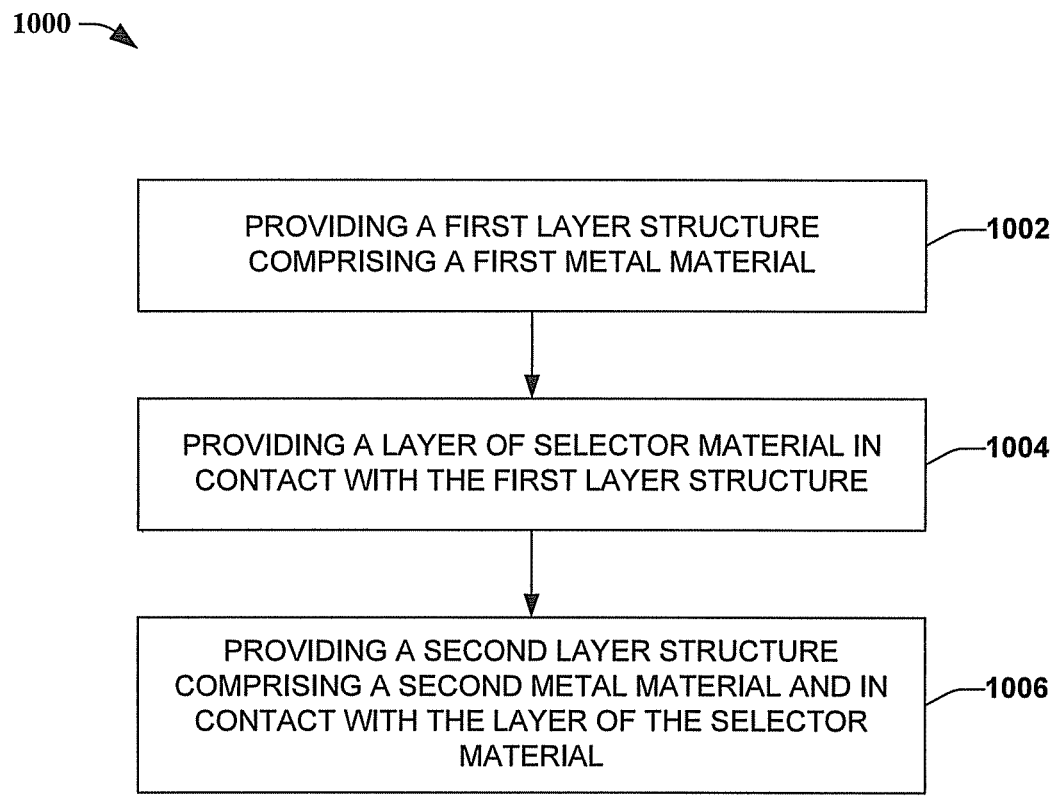
FIG. 10 illustrates a flowchart of a sample method for fabricating a selector device, according to various disclosed embodiments.
Figure 11:
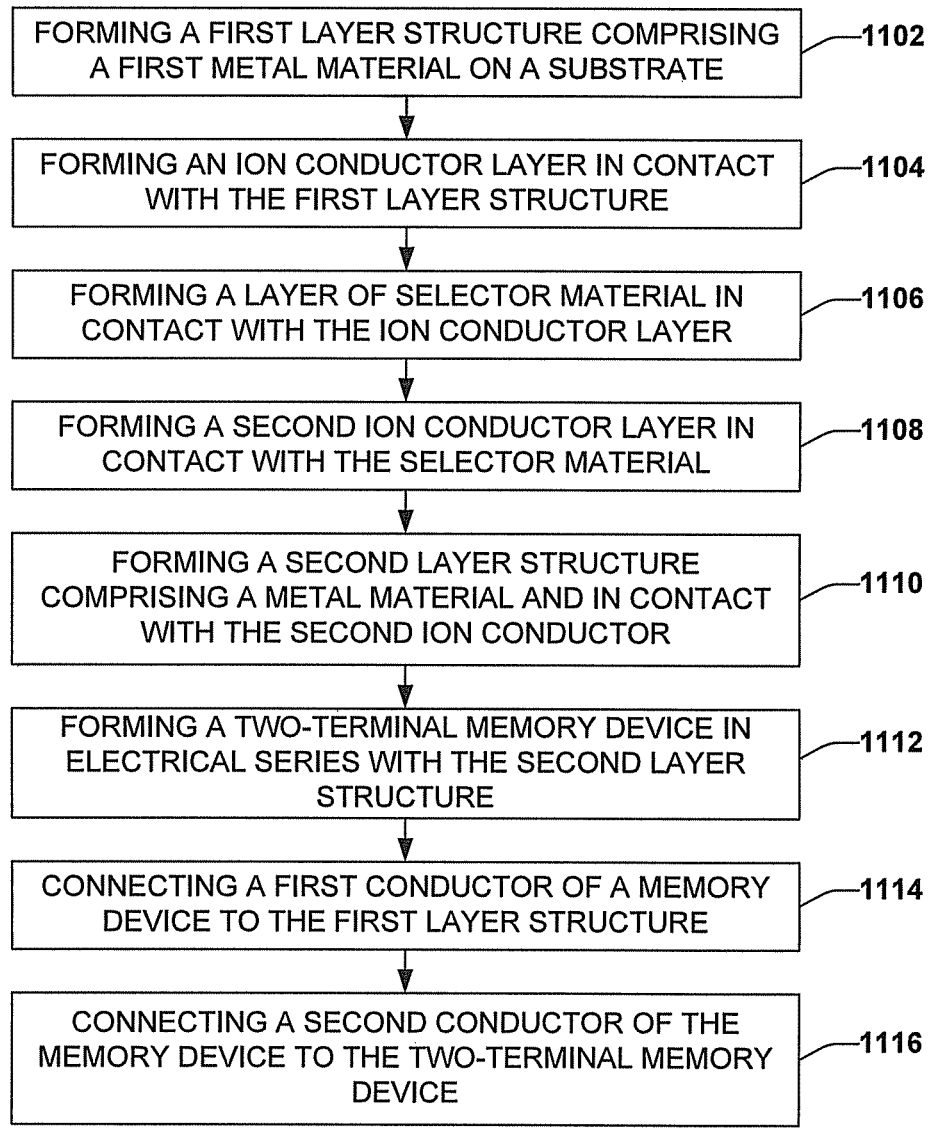
FIG. 11 depicts a flowchart of an example method for fabricating a solid state selector device in series with a two-terminal memory device.
Figure 12:
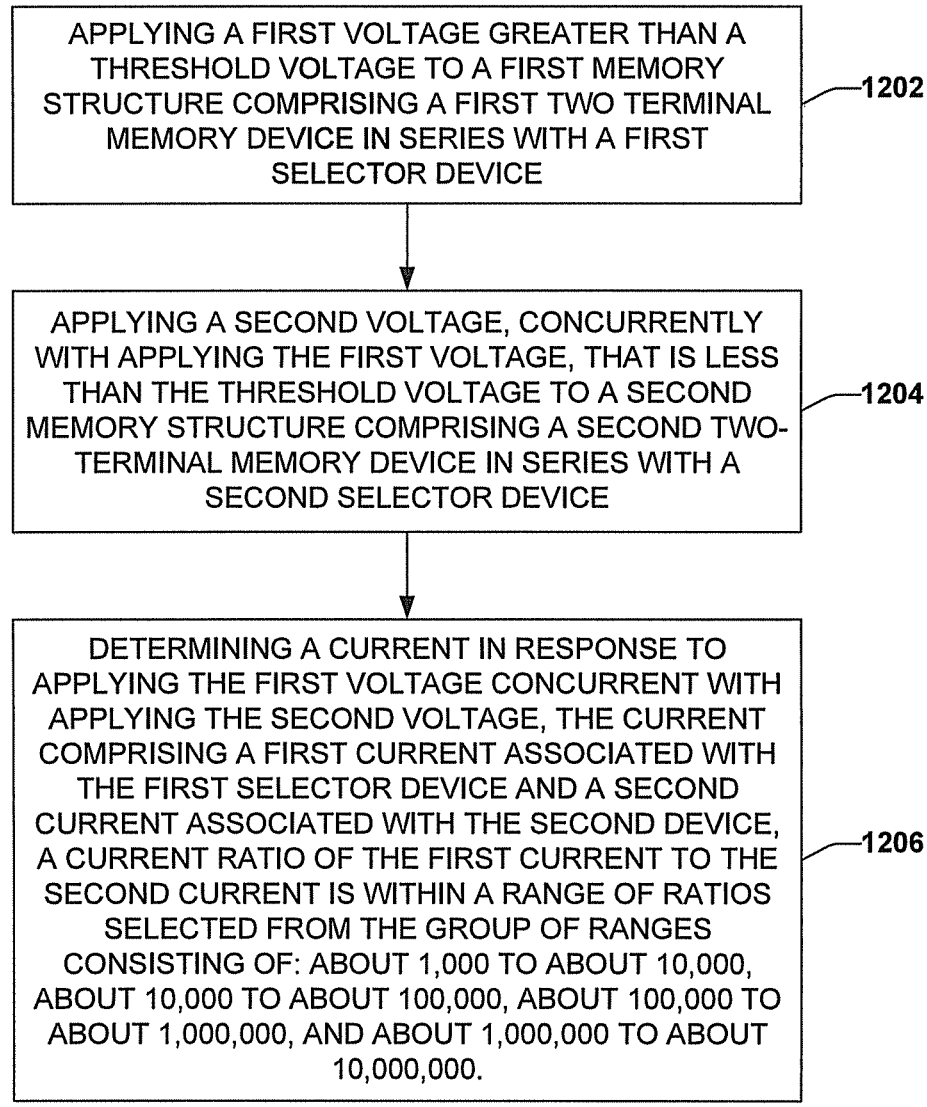
FIG. 12 illustrates a flowchart of an example method for operating an array of memory cells according to further disclosed embodiments.

In view of the exemplary diagrams described supra, process methods that can be implemented in accordance with the disclosed subject matter will be better appreciated with reference to the flow charts of FIGS. 10-12. While for purposes of simplicity of explanation, the methods of FIGS. 10-12 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that some or all of the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 10 illustrates a flowchart of an example method 1000 for fabricating a solid state selector device. At 1002, method 1000 can comprise providing a first layer structure comprising a first metal material. At 1004, method 1000 can comprise providing a layer of selector material adjacent to the first layer structure. In at least one embodiment, the layer of selector material can be in contact with the first layer structure. At 1006, method 1000 can comprise providing a second layer structure comprising a second metal material adjacent to the layer of the selector material. In at least one embodiment, the second layer structure can be in contact with the layer of the selector material. In alternative or additional embodiments, the first metal material can be configured to provide conductive ions to the selector material in response to a voltage applied across the first layer structure and the second layer structure. In other embodiments, the selector material can be configured to allow the conductive ions to permeate within the layer of selector material in response to the voltage applied across the first layer structure and the second layer structure. According to still other embodiments, the first layer structure, the layer of selector material, and the second layer structure can form the solid state selector device. In still further embodiments, the selector device can be disposed in electrical series with a two-terminal memory device.

According to another embodiment(s), the second metal material can be configured to provide further conductive ions to the selector material in response to a second voltage, of different polarity (e.g., opposite polarity) as the voltage, applied across the first layer structure and the second layer structure. In at least one embodiment, the further conductive ions can at least in part dissipate from the layer of the selector material in response to a magnitude of the voltage or the second voltage falling below a threshold voltage magnitude. In a further embodiment(s), conductivity of the layer of selector material can be decreased in response to the further conductive ions at least in part dissipating from the layer of the selector material.

In still other embodiments, the first metal material can be selected from a group consisting of: a noble metal (e.g. Pt, Pd, Ag, Au), a metal alloy containing a noble metal in part, a fast electric field enhanced diffuser (e.g. Ni, Cu, Ag, Co, Fe) and a CMOS wiring metal (e.g. W, Al, Ti, TiN, TaN, WN). In another embodiment, the layer of the selector material can be selected from a group consisting of: an insulator, a non-stoichiometric oxide, a chalcogenide, a solid-electrolyte containing one or more of Ge, Sb, S and Te, and a metal-doped material. In yet another embodiment, providing the first layer structure can further comprise providing a first electrode comprising a metal material that is selected from a group consisting of: an active metal, W, Al, Cu, TiN and TiW. In still another embodiment(s), providing the first layer structure can additionally comprise providing a first ion conductor disposed between the layer of selector material and the metal material that is selected from a second group consisting of: an ion conductor, an electrolyte, a metal oxide, and a metal oxide alloy.

According to further embodiments, method 1000 can additionally comprise forming a plurality of two-terminal memory devices upon a semiconductor substrate, and forming a plurality of selector devices. In one or more embodiments, each of the two-terminal memory devices can be associated with at least one selector device from the plurality of selector devices. In another embodiment(s), the plurality of two-terminal memory devices can comprise the two-terminal memory device and the plurality of selector devices can comprise the selector device. In other embodiments, the method can additionally comprise forming a crossbar memory structure from the plurality of two-terminal memory devices and the plurality of selector devices.

FIG. 11 illustrates a flowchart of an example method 1100 for fabricating a two-terminal memory having a non-linear I-V characteristic, according to additional embodiments of the present disclosure. At 1102, method 1100 can comprise forming a first layer structure comprising a first metal material on a substrate. In at least one embodiment, the substrate can comprise one or more electronic devices (e.g., CMOS devices, SOI devices, and so on) formed therein or thereon. At 1104, method 1100 can comprise forming an ion conductor layer in contact with the first layer structure. Additionally, at 1106, method 1100 can comprise forming a layer of selector material in contact with the ion conductor layer. At 1108, method 1100 can comprise forming a second ion conductor layer in contact with the selector material. Further, at 1110, method 1100 can comprise forming a second layer structure comprising a metal material and in contact with the second ion conductor. In addition to the foregoing, at 1112, method 1100 can comprise forming a two-terminal memory device in electrical series with the second layer structure. At 1114, method 1100 can comprise connecting a first conductor of a memory device to the first layer structure. At 1116, method 1100 can comprise connecting a second conductor of the memory device to the two-terminal memory device.

FIG. 12 illustrates a flowchart of an example method 1200 for operating a crossbar memory array according to further embodiments of the subject disclosure. For instance, the crossbar memory array can comprise a plurality of two-terminal memory devices and a plurality of selector devices, wherein each of the plurality of two-terminal memory devices can be associated in series with one selector device from the plurality of selector devices, wherein each selector device is associated with a first electrical characteristic in response to an applied voltage less than a threshold voltage, and can be associated with a second electrical characteristic in response to an applied voltage greater or equal to the threshold voltage. At 1202, method 1200 can comprise applying a first voltage greater than the threshold voltage to a first memory structure comprising a first two-terminal memory device in series with a first selector device. At 1204, method 1200 can comprise applying a second voltage, concurrently with applying the first voltage, that is less than the threshold voltage to a second memory structure comprising a second two-terminal memory device in series with a second selector device. At 1206, method 1200 can comprise determining a current in response to applying the first voltage concurrent with applying the second voltage. In various embodiments, the current comprises a first current associated with the first selector device and a second current associated with the second selector device. Further, a current ratio of the first current to the second current can be within a range of ratios selected from a group of ranges consisting of: about 1,000 to about 10,000, about 10,000 to about 100,000, about 100,000 to about 1,000,000, and about 1,000,000 to about 10,000,000. In further embodiments, the first two-terminal memory device and the second two-terminal memory device can both be in a programmed state.

According to one or more additional embodiments, a selector device of the plurality of selector devices can comprise a first active metal layer, a second active metal layer, and a selection layer disposed between the first active metal layer and the second active metal layer. In another embodiment(s), applying the second voltage concurrently with applying the first voltage can further comprise applying the first voltage greater than the threshold voltage to the first selector device to thereby cause a conductive filament of metallic ion particles of a first active metal layer to be formed within the selection layer of the first selector device, and applying the second voltage less than the threshold voltage to the second selector device, wherein a conductive filament of metallic ion particles of a first active metal layer is not formed within a selection layer of the second selector device (or is formed only within a subset of the selection layer of the second selector device, and does not provide a conductive path(s) through the selection layer of the second selector device).

According to further embodiments, the threshold voltage can be within a range selected from a group of ranges consisting of: about 0.1 volt to about 2 volts, and about 2 volts to about 4 volts. In another embodiment(s), the second current can be selected from a range of about $1 \times 10^{-8}$ amps to about $1 \times 10^{-14}$ amps. In still other embodiments, the first current can be selected from a range of about $1 \times 10^{-3}$ amps to about $1 \times 10^{-6}$ amps.

In additional embodiments, applying the second voltage concurrently with applying the first voltage can further comprise applying the second voltage less than the threshold voltage to a second plurality of two-terminal memory devices, different from the plurality of two-terminal memory devices, in series with a second plurality of selector devices, different from the plurality of selector devices. In another embodiment, a number of two-terminal memory devices in the second plurality of two-terminal memory devices can be selected from a range of about 1,000 to about 250,000. In still other embodiments, the first two-terminal memory device and the second two-terminal memory device are both in an erased state. In yet another embodiment(s), the two-terminal memory device comprises a filamentary-based resistive memory device.

In various embodiments of the subject disclosure, disclosed memory or memory architectures can be employed as a standalone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 13 and 14, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, several structural, performance, and reliability problems became evident. A subset of these or similar considerations are addressed by the disclosed aspects.

Figure 13:
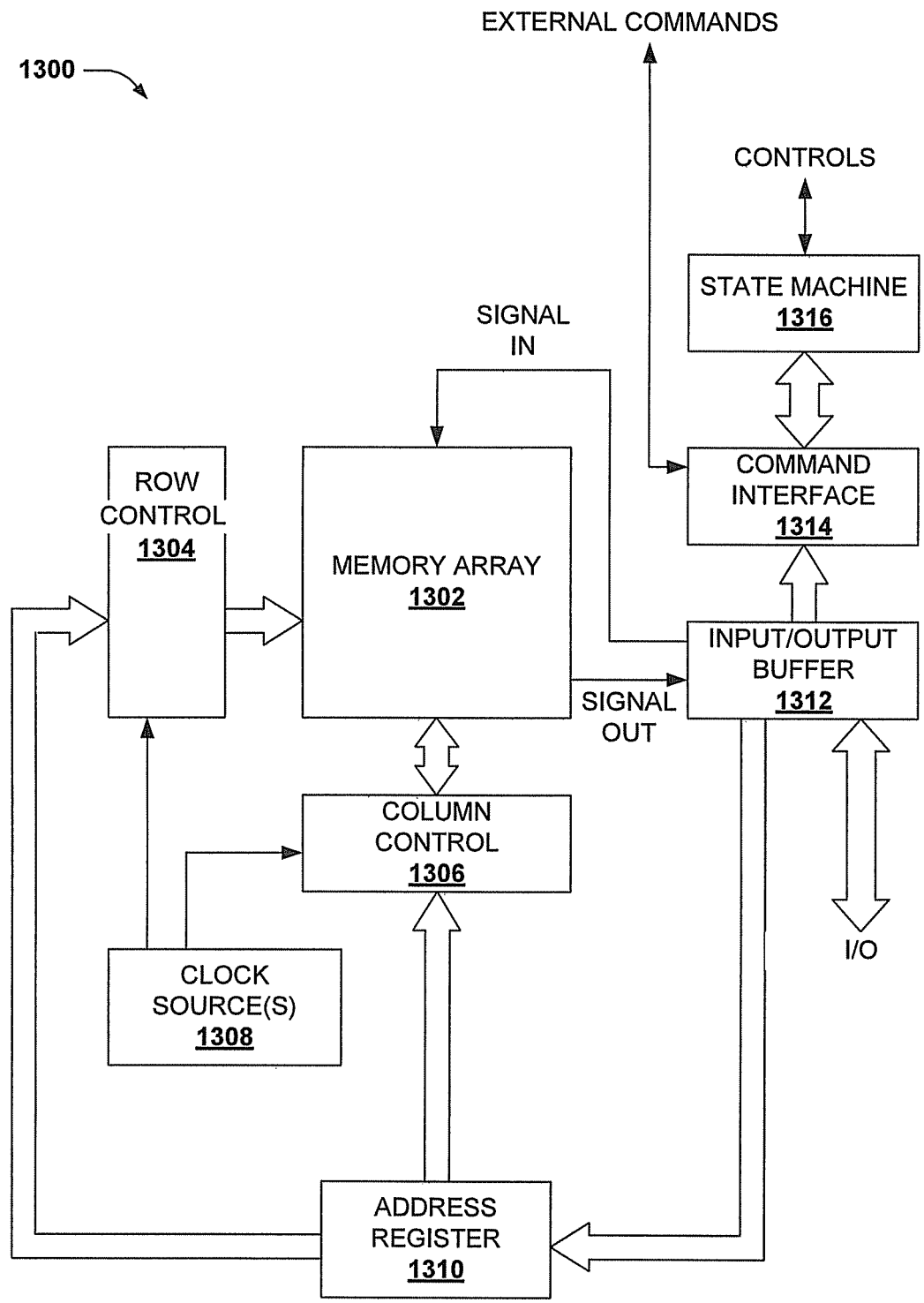
FIG. 13 depicts a block diagram of a sample operating and control environment for a memory device according to various disclosed embodiments.

In order to provide a context for the various aspects of the disclosed subject matter, FIG. 13, as well as the following discussion, is intended to provide a brief, general description of a suitable environment in which various aspects of the disclosed subject matter can be implemented or processed. While the subject matter has been described above in the general context of solid state memory and semiconductor architectures and process methodologies for fabricating and operating such memory or architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer (e.g., computer 1402 of FIG. 14, infra), which can include single-processor or multi-processor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject innovation can be practiced on stand-alone electronic devices, such as a memory card, Flash memory module, removable memory, or the like. In a distributed computing environment, program modules can be located in both local and remote memory storage modules or devices.

FIG. 13 illustrates a block diagram of an example operating and control environment 1300 for a memory cell array 1302 according to aspects of the subject disclosure. In at least one aspect of the subject disclosure, memory cell array 1302 can comprise a variety of memory cell technology. In at least one embodiment, memory cells of the memory cell technology can comprise two-terminal memory having a non-linear I-V response(s), as described herein. In another embodiment, memory cell array 1302 can store operations configured to cause a device to fabricate a two-terminal memory cell electrically in series with a selector device.

A column controller 1306 can be formed adjacent to memory cell array 1302. Moreover, column controller 1306 can be electrically coupled with bit lines of memory cell array 1302. Column controller 1306 can control respective bitlines, applying suitable program, erase or read voltages to selected bitlines.

In addition, operating and control environment 1300 can comprise a row controller 1304. Row controller 1304 can be formed adjacent to column controller 1306, and electrically connected with word lines of memory cell array 1302. Row controller 1304 can select particular rows of memory cells with a suitable selection voltage. Moreover, row controller 1304 can facilitate program, erase or read operations by applying suitable voltages at selected word lines.

A clock source(s) 1308 can provide respective clock pulses to facilitate timing for read, write, and program operations of row controller 1304 and column controller 1306. Clock source(s) 1308 can further facilitate selection of word lines or bit lines in response to external or internal commands received by operating and control environment 1300. An input/output buffer 1312 can be connected to an external host apparatus, such as a computer or other processing device (not depicted, but see e.g., computer 802 of FIG. 12, infra) by way of an I/O buffer or other I/O communication interface. Input/output buffer 1312 can be configured to receive write data, receive an erase instruction, output readout data, and receive address data and command data, as well as address data for respective instructions. Address data can be transferred to row controller 1304 and column controller 1306 by an address register 1310. In addition, input data is transmitted to memory cell array 1302 via signal input lines, and output data is received from memory cell array 1302 via signal output lines. Input data can be received from the host apparatus, and output data can be delivered to the host apparatus via the I/O buffer.

Commands received from the host apparatus can be provided to a command interface 1314. Command interface 1314 can be configured to receive external control signals from the host apparatus, and determine whether data input to the input/output buffer 1312 is write data, a command, or an address. Input commands can be transferred to a state machine 1316.

State machine 1316 can be configured to manage programming and reprogramming of memory cell array 1302. State machine 1316 receives commands from the host apparatus via input/output buffer 1312 and command interface 1314, and manages read, write, erase, data input, data output, and similar functionality associated with memory cell array 1302. In some aspects, state machine 1316 can send and receive acknowledgments and negative acknowledgments regarding successful receipt or execution of various commands.

To implement read, write, erase, input, output, etc., functionality, state machine 1316 can control clock source(s) 1308. Control of clock source(s) 1308 can cause output pulses configured to facilitate row controller 1304 and column controller 1306 implementing the particular functionality. Output pulses can be transferred to selected bit lines by column controller 1306, for instance, or word lines by row controller 1304, for instance.

In connection with FIG. 14, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 14:
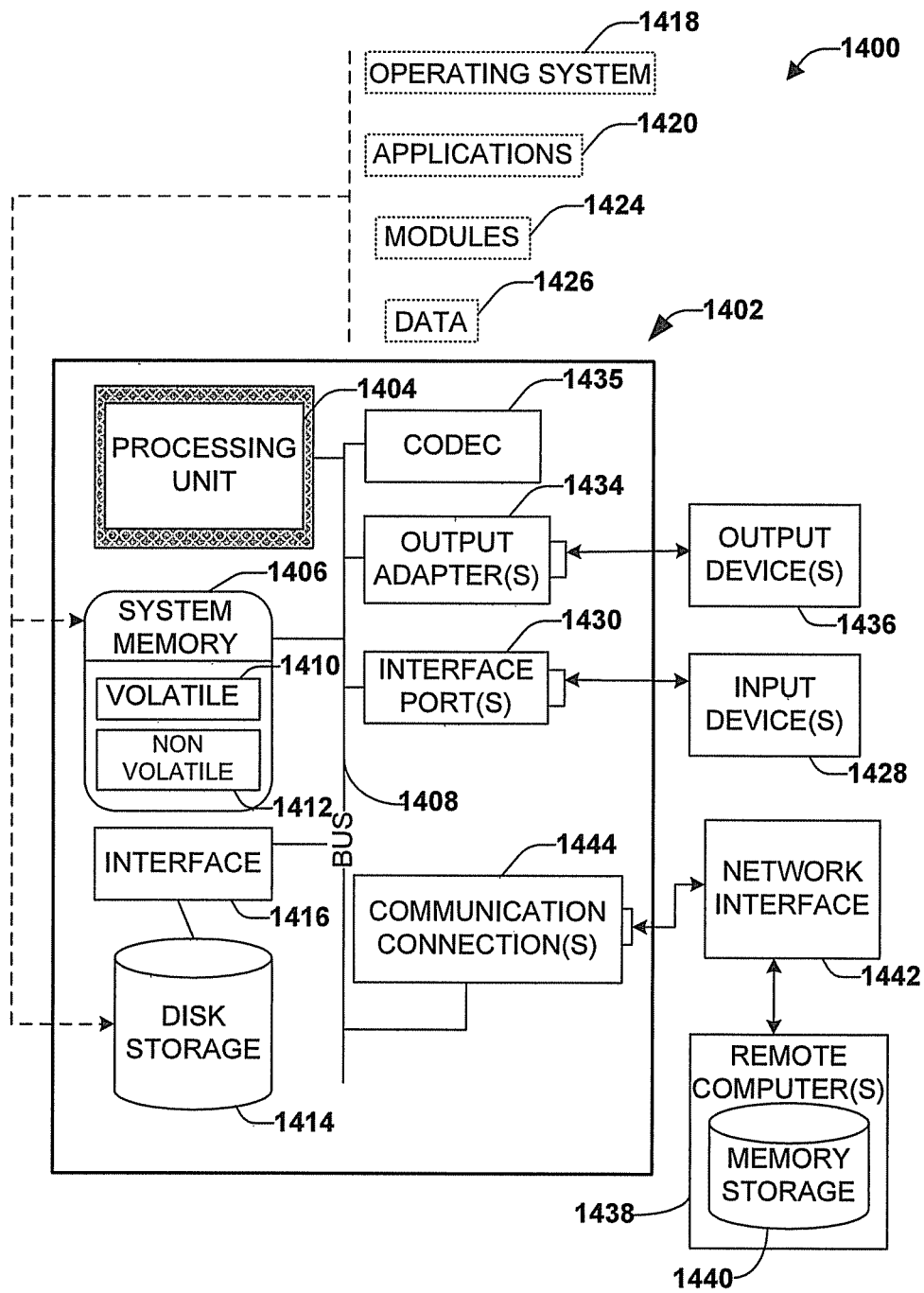
FIG. 14 illustrates a block diagram of an example computing environment that can be implemented in conjunction with various embodiments.

With reference to FIG. 14, a suitable operating environment 1400 for implementing various aspects of the claimed subject matter includes a computer 1402. The computer 1402 includes a processing unit 1404, a system memory 1406, a codec 1435, and a system bus 1408. The system bus 1408 couples system components including, but not limited to, the system memory 1406 to the processing unit 1404. The processing unit 1404 can be any of various available processors. Dual microprocessors and other multiprocessor architectures also can be employed as the processing unit 1404.

The system bus 1408 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1406 includes volatile memory 1410 and non-volatile memory 1414, which can employ one or more of the disclosed memory architectures, in various embodiments. The basic input/output system (BIOS), containing the basic routines to transfer information between elements within the computer 1402, such as during start-up, is stored in non-volatile memory 1412. In addition, according to present innovations, codec 1435 may include at least one of an encoder or decoder, wherein the at least one of an encoder or decoder may consist of hardware, software, or a combination of hardware and software. Although, codec 1435 is depicted as a separate component, codec 1435 may be contained within non-volatile memory 1412. By way of illustration, and not limitation, non-volatile memory 1412 can include read only memory (ROM), programmable ROM (PROM), electrically programmable ROM (EPROM), electrically erasable programmable ROM (EEPROM), or Flash memory. Non-volatile memory 1412 can employ one or more of the disclosed memory architectures, in at least some disclosed embodiments. Moreover, non-volatile memory 1412 can be computer memory (e.g., physically integrated with computer 1402 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1410 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1402 may also include removable/non-removable, volatile/non-volatile computer storage medium. FIG. 14 illustrates, for example, disk storage 1414. Disk storage 1414 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 1414 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1414 to the system bus 1408, a removable or non-removable interface is typically used, such as interface 1416. It is appreciated that disk storage 1414 can store information related to a user. Such information might be stored at or provided to a server or to an application running on a user device. In one embodiment, the user can be notified (e.g., by way of output device(s) 1436) of the types of information that are stored to disk storage 1414 and/or transmitted to the server or application. The user can be provided the opportunity to opt-in or opt-out of having such information collected and/or shared with the server or application (e.g., by way of input from input device(s) 1428).

It is to be appreciated that FIG. 14 describes software that acts as an intermediary between users and the basic computer resources described in the suitable operating environment 1400. Such software includes an operating system 1418. Operating system 1418, which can be stored on disk storage 1414, acts to control and allocate resources of the computer 1402. Applications 1420 take advantage of the management of resources by operating system 1418 through program modules 1424, and program data 1426, such as the boot/shutdown transaction table and the like, stored either in system memory 1406 or on disk storage 1414. It is to be appreciated that the claimed subject matter can be implemented with various operating systems or combinations of operating systems.

A user enters commands or information into the computer 1402 through input device(s) 1428. Input devices 1428 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1404 through the system bus 1408 via interface port(s) 1430. Interface port(s) 1430 include, for example, a serial port, a parallel port, a game port, and a universal serial bus (USB). Output device(s) 1436 use some of the same type of ports as input device(s) 1428. Thus, for example, a USB port may be used to provide input to computer 1402 and to output information from computer 1402 to an output device 1436. Output adapter 1434 is provided to illustrate that there are some output devices, such as monitors, speakers, and printers, among other output devices, which require special adapters. The output adapter 1434 can include, by way of illustration and not limitation, video and sound cards that provide a means of connection between the output device 1436 and the system bus 1408. It should be noted that other devices and/or systems of devices provide both input and output capabilities such as remote computer(s) 1438.

Computer 1402 can operate in a networked environment using logical connections to one or more remote computers, such as remote computer(s) 1438. The remote computer(s) 1438 can be a personal computer, a server, a router, a network PC, a workstation, a microprocessor based appliance, a peer device, a smart phone, a tablet, or other network node, and typically includes many of the elements described relative to computer 1402. For purposes of brevity, only a memory storage device 1440 is illustrated with remote computer(s) 1438. Remote computer(s) 1438 is logically connected to computer 1402 through a network interface 1442 and then connected via communication connection(s) 1444. Network interface 1442 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1444 refers to the hardware/software employed to connect the network interface 1442 to the system bus 1408. While communication connection 1444 is shown for illustrative clarity inside computer 1402, it can also be external to computer 1402. The hardware/software necessary for connection to the network interface 1442 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for forming a selector device for a two-terminal memory device, comprising:
   providing a first layer structure comprising a first metal material;
   providing a layer of selector material in contact with the first layer structure; and
   providing a second layer structure comprising a second metal material and in contact with the layer of the selector material, wherein:
   the first metal material is configured to provide conductive ions to the selector material in response to a voltage applied across the first layer structure and the second layer structure,
   the selector material is configured to allow the conductive ions to permeate within the layer of selector material and form a conductive filament across the selector material in response to the voltage applied across the first layer structure and the second layer structure, wherein the selector material is configured to facilitate a break in electrical continuity of the conductive filament in response to a reduction in magnitude of the voltage to a reduced voltage, greater than zero, and having a same polarity as the voltage, the first layer structure, the layer of selector material, and the second layer structure form the selector device, and the selector device is disposed in electrical series with the two-terminal memory device.

2. The method of claim 1, wherein the second metal material is configured to provide further conductive ions to the selector material in response to a second voltage, of opposite polarity as the voltage, applied across the first layer structure and the second layer structure.

3. The method of claim 2, wherein:
the further conductive ions at least in part dissipate from the layer of selector material in response to a reduction in magnitude of the second voltage to a second reduced voltage, greater than zero magnitude; and conductivity of the layer of selector material is decreased in response to the further conductive ions at least in part dissipating from the layer of the selector material.

4. The method of claim 3, wherein the magnitude of the voltage is substantially the same as a second magnitude of the second voltage.

5. The method of claim 4, wherein providing the first layer structure and providing the second layer structure further comprise selecting a material comprising a common metal for the first metal material and for the second metal material.

6. The method of claim 3, wherein the magnitude of the voltage is different in magnitude from a second magnitude of the second voltage.

7. The method of claim 6, wherein providing the first layer structure and providing the second layer structure further comprising employing different metals for the first metal material and for the second metal material.

8. The method of claim 1, wherein at least one of:
the first metal material or the second metal material is selected from a group consisting of: a noble metal, a metal alloy at least in part comprising a noble metal, a fast electric field enhanced diffuser material, Ni, Cu, Ag, Co, Fe, W, Al, Ti, TiN, TaN, WN, and an alloy of one or more of the foregoing; or the layer of the selector material is selected from a group consisting of: an insulator, a non-stoichiometric oxide, a chalcogenide, a solid-electrolyte comprising Ge, Sb, S and Te, and a metal-doped material.

9. The method of claim 1 wherein the providing the first layer structure or the second layer structure further comprises:
providing a first electrode or a second electrode, respectively, comprising the first metal material or the second metal material, respectively, that is selected from a group consisting of: Co, Ni, Fe, Ag, Ti, W, Al, Cu, TiN, TaN, TiW, and an alloy of one or more of the foregoing; and at least one of:
providing a first ion conductor disposed between the layer of selector material and the first electrode that is selected from a second group consisting of: an ion conductor, a solid-electrolyte, a metal oxide, and a metal oxide alloy; or providing a second ion conductor disposed between the layer of selector material and the second electrode that is selected from the second group.

10. The method of claim 1, further comprising:
forming a plurality of two-terminal memory devices upon a semiconductor substrate; and
forming a plurality of selector devices, wherein:
each of the two-terminal memory devices are associated with at least one selector device from the plurality of selector devices, the plurality of two-terminal memory devices comprises the two-terminal memory device, and
the plurality of selector devices comprises the selector device.

11. The method of claim 10, further comprising forming a crossbar memory structure from the plurality of two-terminal memory devices and the plurality of selector devices.

12. The method of claim 1, wherein providing the layer of selector material further comprises forming the layer of selector material to have few defect sites per volume of selector material suitable to trap the conductive ions.

13. A selector device for a two-terminal memory, comprising:
a first layer structure comprising a first metal material;
a layer of selector material in contact with the first layer structure; and
a second layer structure in contact with the layer of the selector material and comprising a second metal material, wherein:
the first metal material is configured to provide conductive ions to the selector material in response to a threshold voltage applied across the first layer structure and the second layer structure, the second layer structure is configured to provide additional conductive ions to the selector material in response to a second voltage, having different polarity from the threshold voltage, applied across the first layer structure and the second layer structure, the selector material is configured to allow the conductive ions to permeate within the layer of selector material in response to the threshold voltage applied across the first layer structure and the second layer structure and is configured to allow the additional conductive ions to permeate within the layer of selector material on response to a second voltage, of different polarity from the threshold voltage, applied across the first layer structure and the second layer structure, and the selector device is disposed in electrical series with the two-terminal memory device.

14. The selector device of claim 13, wherein:
the selector material conducts a first current in response to an applied voltage less than the threshold voltage;
the conductive ions within the selector material facilitate conduction of a second current in response to the applied voltage being greater or equal to the threshold voltage; and
a ratio of the second current to the first current is about 1,000 or greater.

15. The selector device of claim 14, wherein the selector device changes from conducting the first current to conducting the second current in response to the applied voltage, having been greater or equal to the threshold voltage, falling to a positive voltage less than the threshold voltage.

16. The selector device of claim 13, wherein:
the additional conductive ions permeate within the selector material to form a conductive sub-region thereof, in response to the second voltage;
the layer of selector material is associated with an increased current in response to permeation of the additional conductive ions within the selector material;
the additional conductive ions at least in part deform the conductive sub-region of the layer of selector material in response to a magnitude of the second voltage falling below a second magnitude threshold;
the layer of selector material is associated with a decreased current in response to the additional ions at least in part deforming the conductive sub-region; and a ratio of the decreased current to the increased current is 1,000 or greater.

17. The selector device of claim 13, wherein the threshold voltage is selected from a range of about 0.1 volts to about 4 volts and an electrical response of the selector device is between at least one of the following ranges:
   from about 1 milliVolt (mV)/decade to about 60 mV/decade; or
   from about 0.15 decades/mV to about 1 decade/mV.

18. The selector device of claim 13, wherein the selector material has a thickness selected from a range of about 0.5 nm to about 50 nm.

19. The selector device of claim 13, wherein at least one of:
   the first metal material is selected from a group consisting of: a noble metal, a metal alloy at least in part comprising a noble metal, a fast electric field enhanced diffuser material, Ni, Cu, Ag, Co, Fe, W, Al, Ti, TiN, TaN, WN and a suitable alloy of the foregoing; or
   the layer of selector material is selected from a group consisting of: an insulator, a non-stoichiometric oxide, a chalcogenide, a solid-electrolyte comprising Ge, Sb, S, or Te, and a metal-doped material.

20. The selector device of claim 13, wherein the first layer structure or the second layer structure comprises:
   a first electrode; and
   a first ion conductor disposed between the layer of selector material and the first electrode.

\* \* \* \* \*